United States Patent [19]
Yamane et al.

[11] Patent Number: 6,025,979
[45] Date of Patent: Feb. 15, 2000

[54] MAGNETORESISTIVE SENSOR AND HEAD WITH ALTERNATING MAGNETIC BIAS FIELD

[75] Inventors: Haruki Yamane; Juro Mita, both of Tokyo, Japan

[73] Assignee: Oki Electric Industry Co., Ltd., Tokyo, Japan

[21] Appl. No.: 09/144,854

[22] Filed: Sep. 1, 1998

[30] Foreign Application Priority Data

Sep. 4, 1997 [JP] Japan ................................. 9-239564
Sep. 4, 1997 [JP] Japan ................................. 9-239565
Sep. 25, 1997 [JP] Japan ................................. 9-259710

[51] Int. Cl.[7] ...................................................... G11B 5/39
[52] U.S. Cl. ................................................................ 360/113
[58] Field of Search .......................... 360/113; 338/32 R; 324/252

[56] References Cited

U.S. PATENT DOCUMENTS

| 4,075,671 | 2/1978 | Cheatham et al. ..................... 360/113 |
| 4,259,703 | 3/1981 | Young et al. ........................... 360/113 |
| 4,679,107 | 7/1987 | Imakoshi et al. ...................... 360/113 |
| 5,574,605 | 11/1996 | Baumgart et al. .................... 360/113 |
| 5,585,983 | 12/1996 | Sugiyama et al. ..................... 360/113 |

FOREIGN PATENT DOCUMENTS

| 60-35302 | 2/1985 | Japan . |
| 62-046418 | 2/1987 | Japan . |
| 5-114761 | 5/1993 | Japan . |
| 6-111252 | 4/1994 | Japan . |
| 6-203339 | 7/1994 | Japan . |

Primary Examiner—William J. Klimowicz
Attorney, Agent, or Firm—Venable; Robert J. Frank

[57] ABSTRACT

A magnetoresistive sensor has a magnetic bias field source that generates an alternating magnetic bias field, a giant magnetoresistive sensing element positioned in the alternating magnetic bias field, and a resistance detecting circuit that detects changes in the electrical resistance of the giant magnetoresistive sensing element caused by the combined action of the alternating magnetic bias field and an external magnetic field. The alternating magnetic bias field enables small external magnetic fields to be detected with high sensitivity.

35 Claims, 23 Drawing Sheets

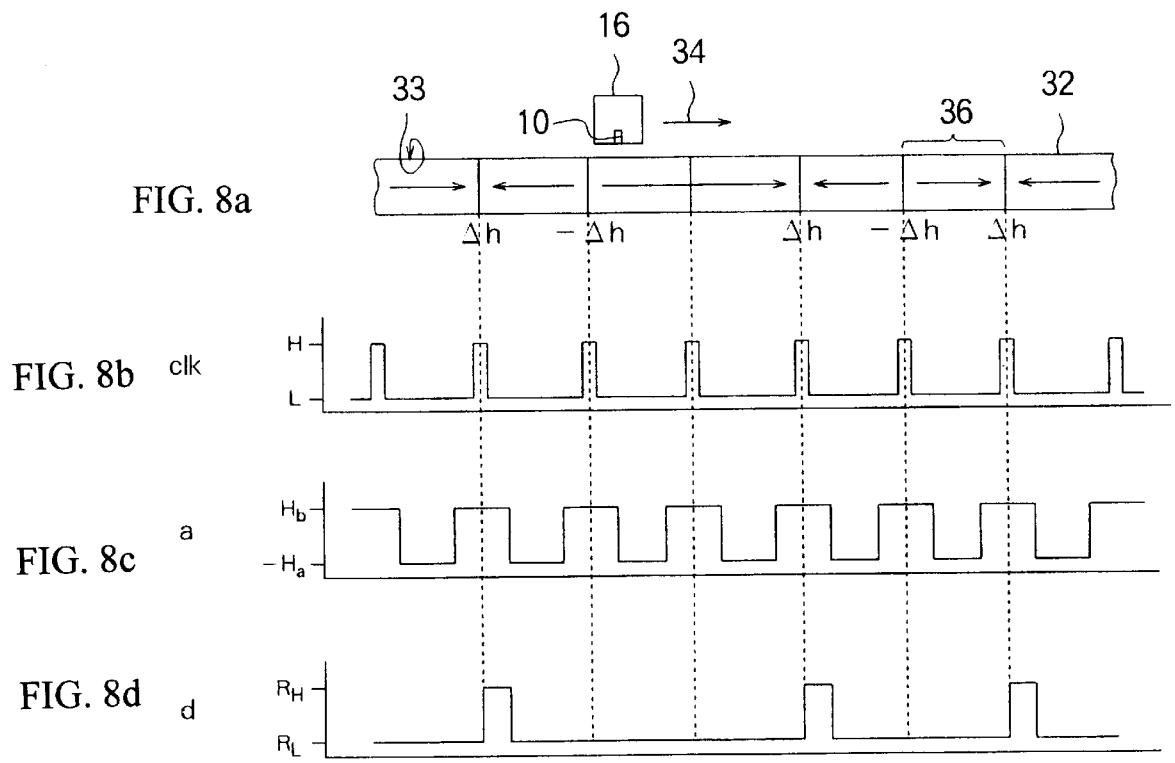
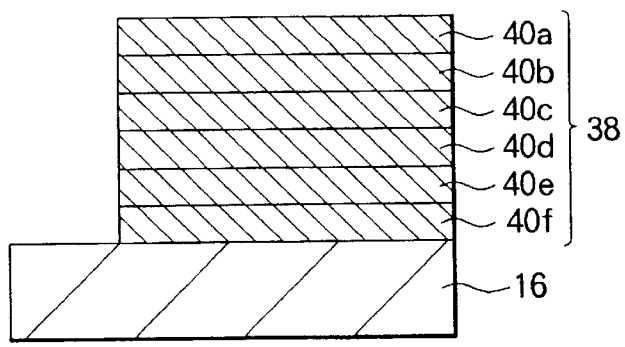
FIG. 9

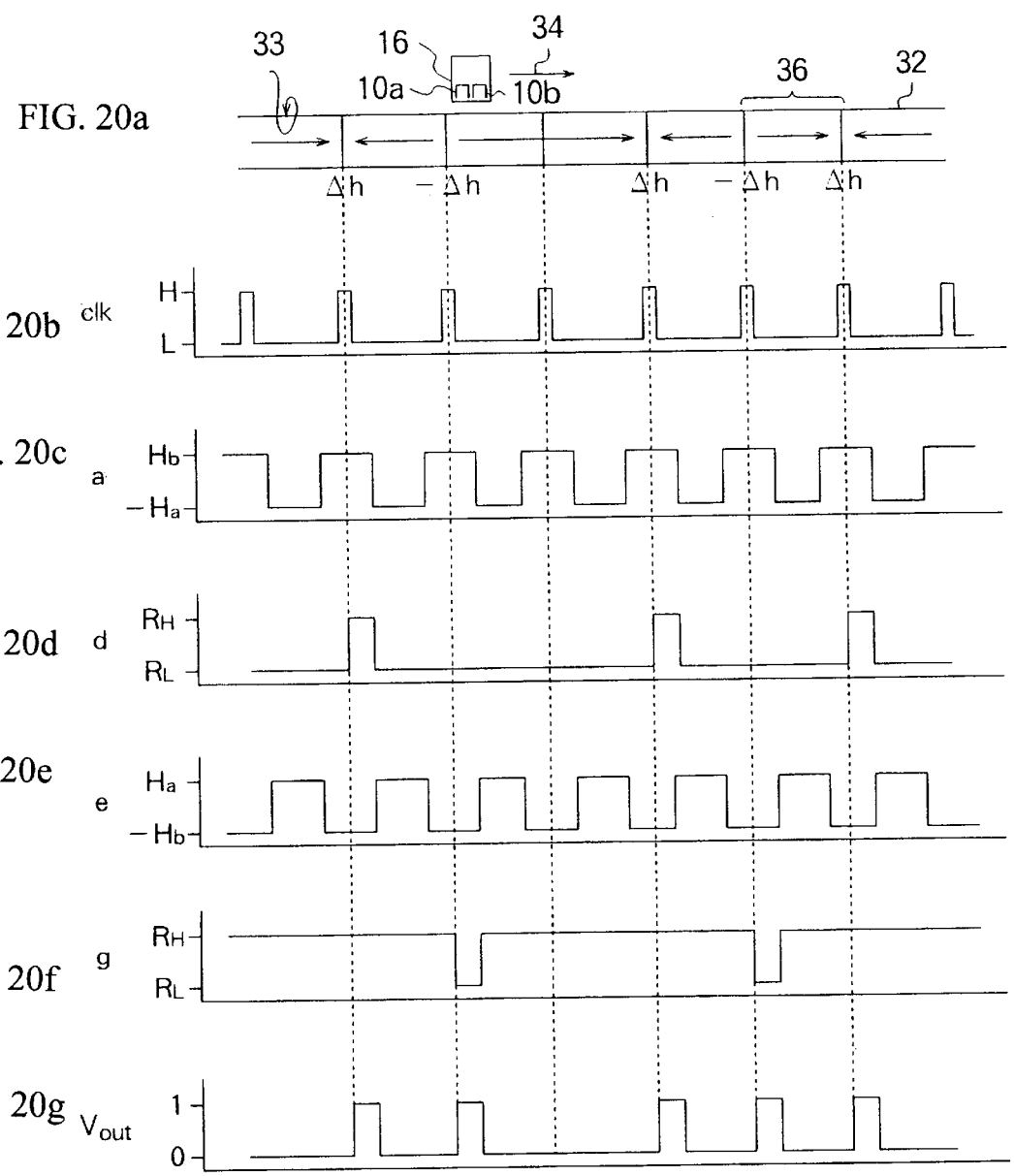

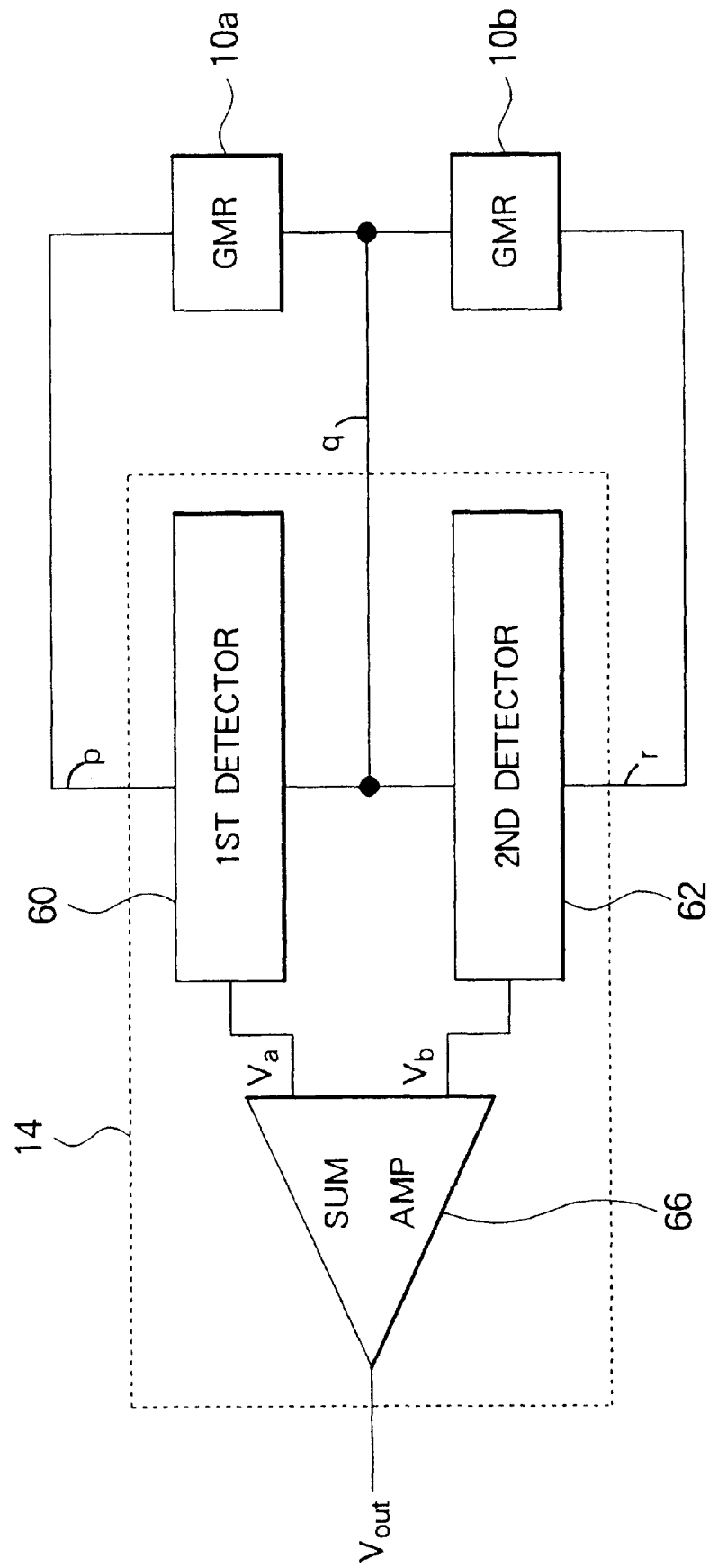

FIG. 22b clk 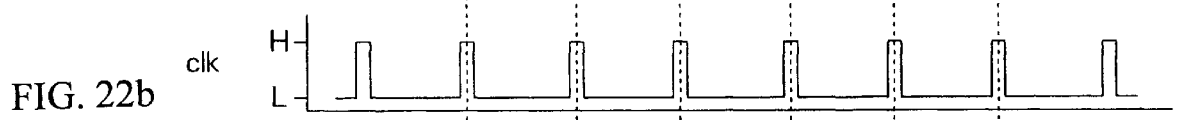
FIG. 22c a 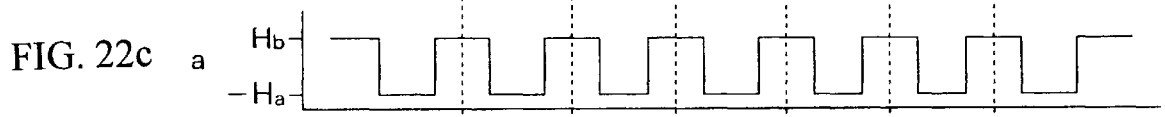
FIG. 22d d 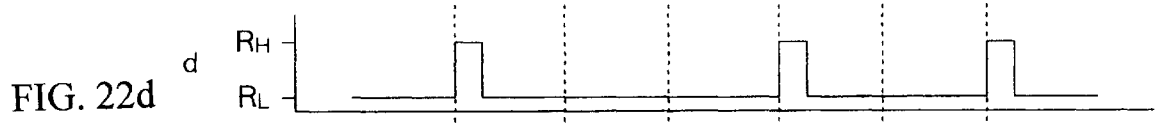
FIG. 22e e 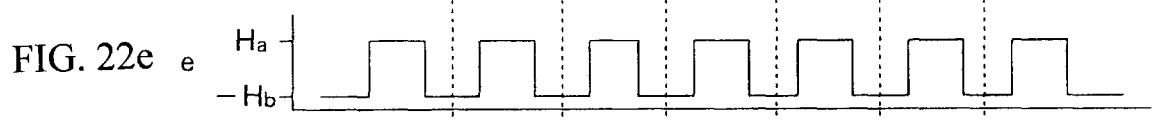
FIG. 22f g 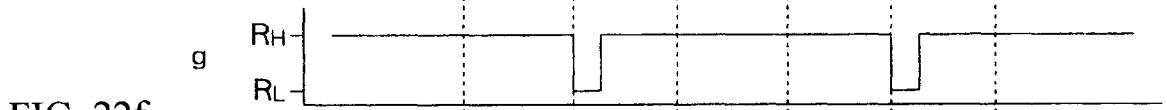
FIG. 22g $V_{out}$ 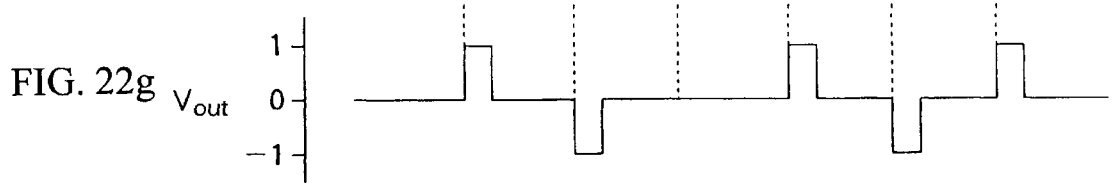

MAGNETIC FIELD INTENSITY

MAGNETORESISTIVE SENSOR AND HEAD WITH ALTERNATING MAGNETIC BIAS FIELD

BACKGROUND OF THE INVENTION

The present invention relates to a magnetoresistive sensor for sensing an external magnetic field, and a magnetoresistive head for reading data from a magnetic recording medium. More particularly, the invention relates to a magnetoresistive sensor and magnetoresistive head employing a giant magnetoresistive sensing element biased by an alternating magnetic field.

A giant magnetoresistive (GMR) sensing element comprises a pair of ferromagnetic layers separated by a non-magnetic layer. The magnetization of the first ferromagnetic layer is pinned in a fixed orientation. The pinning may be effected by exchange coupling with an adjacent antiferromagnetic layer, or simply by the use of a ferromagnetic material with high coercivity. The magnetization of the second ferromagnetic layer, which generally comprises a magnetically soft material, is not pinned, and can be readily altered by an external magnetic field. The GMR sensing element may have a single pair of ferromagnetic layers, or many pairs of layers stacked one over another.

The electrical resistance of a GMR sensing element is affected by spin scattering of conduction electrons in the first and second ferromagnetic layers. The amount of spin scattering depends on the angle between the magnetization directions of the two layers. When the magnetization of the second ferromagnetic layer is aligned with an external magnetic field, the orientation of the external field can be detected from the electrical resistance of the GMR sensing element. Data can be read from magnetic recording media in this way, the external field in this case being a leakage field from the recorded data bits.

In recent disk drives, read heads employing GMR sensing elements have demonstrated significantly higher sensitivity than heads employing previous sensing technologies. The enhanced sensitivity permits data to be recorded at higher densities. GMR sensing elements have also been used in devices such as metal detectors and angular position sensors, where they combine the advantages of high sensitivity and small size.

The performance of conventional GMR sensors and GMR heads is determined to a large extent by the magnetic properties of the second or unpinned ferromagnetic layer. Desired further improvements in sensitivity thus depend on the development of improved ferromagnetic materials, but this has turned out to be extremely difficult.

SUMMARY OF THE INVENTION

It is accordingly an object of the present invention to increase the sensitivity of a magnetoresistive sensor, regardless of the magnetic materials used therein.

A related object of the invention is to increase the sensitivity of a magnetoresistive head, regardless of the magnetic materials used therein.

A further object is to increase the density at which data can be read from magnetic recording media.

The invented magnetoresistive sensor has a magnetic bias field source that generates an alternating magnetic bias field. A GMR sensing element is disposed within the alternating magnetic bias field. A resistance detecting circuit detects changes in the electrical resistance of the GMR sensing element caused by the alternating magnetic bias field and an external magnetic field acting in combination.

The GMR sensing element preferably comprises a first ferromagnetic layer with magnetization pinned in a first direction, and a second ferromagnetic layer with alterable magnetization. The alternating magnetic bias field preferably alternates between the first direction and a second direction opposite to the first direction.

According to a first aspect of the invention, the alternating magnetic bias field, by itself, brings the magnetization of the second ferromagnetic layer into only one direction among the first direction and the second direction. When an appropriate external magnetic field is added, however, the alternating magnetic bias field switches the magnetization of the second ferromagnetic layer between the first and second directions. This aspect of the invention can be employed in a magnetoresistive head to read data from a magnetic recording medium. To detect both positive and negative magnetic transitions on the magnetic recording medium, the magnetoresistive head may have two GMR sensing elements, and two magnetic bias field source generating complementary bias fields.

According to a second aspect of the invention, the alternating magnetic bias field, by itself, switches the magnetization of the second ferromagnetic layer between the first and second directions. The magnetoresistive sensor in this case preferably also has an alternating-current source that generates an alternating current from which the alternating magnetic bias field is produced, a sampling circuit for sampling the alternating current when changes in the electrical resistance of the GMR sensing element are detected, and an output conversion circuit for converting the sample values to an output signal.

External magnetic fields that would be intrinsically too weak to change the electrical resistance of the GMR sensing element can be sensed from the changes they cause in cooperation with the alternating magnetic bias field. Data can therefore be read from magnetic recording media even if the data are recorded at relatively high densities and produce only weak magnetic fields.

BRIEF DESCRIPTION OF THE DRAWINGS

In the attached drawings:

FIGS. 8a, 8b, 8c and 8d are diagrams illustrating the operation of the first embodiment;

FIG. 9 is a sectional view of another GMR sensing element, used in a second embodiment of the invention;

FIGS. 20a, 20b, 20c, 20d, 20e, 20f and 20g are diagrams illustrating the operation of the fourth embodiment;

FIG. 21 is a block diagram illustrating the internal structure of the resistance detecting circuit in a variation of the fourth embodiment;

FIGS. 22a, 22b, 22c, 22d, 22e, 22f and 22g are diagrams illustrating the operation of the variation of the fourth embodiment;

DETAILED DESCRIPTION OF THE INVENTION

Embodiments of the invention will be described with reference to the attached drawings. The drawings illustrate the embodiments schematically, and do not necessarily show exact relative sizes, shapes, positional relationships, or timing relationships.

Figure 1:
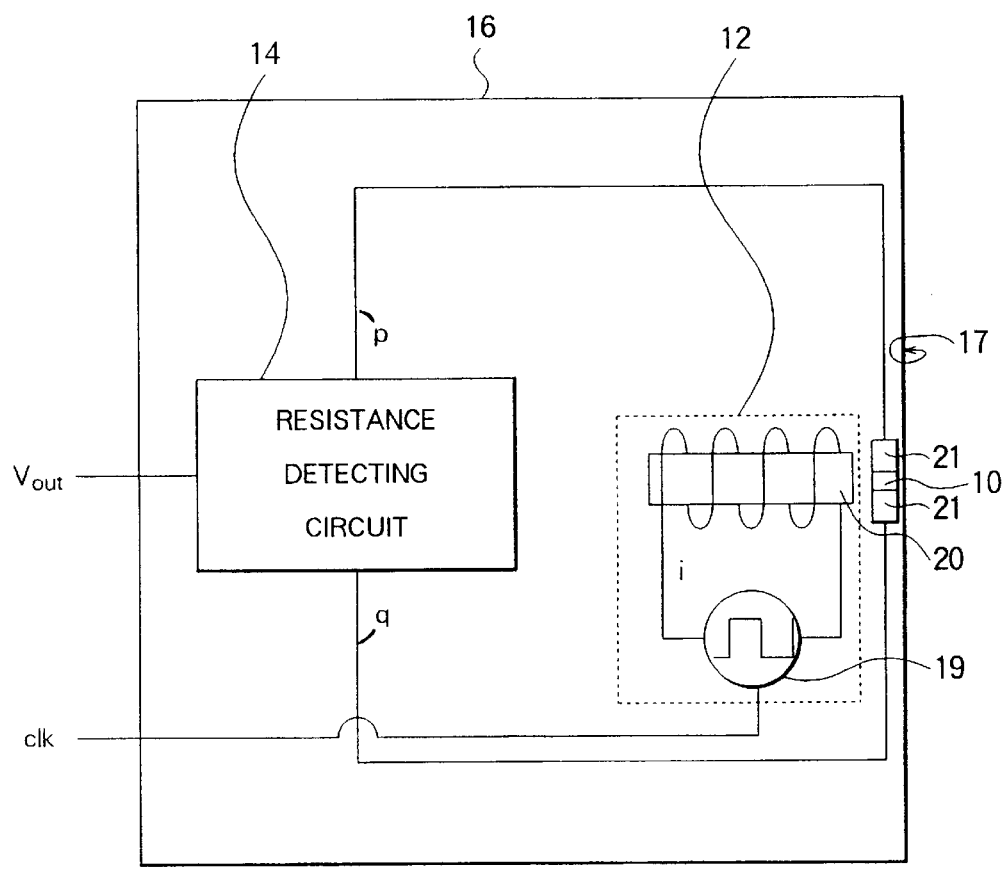
FIG. 1 is a schematic plan view of a magnetoresistive head illustrating a first embodiment of the invention.

As a first embodiment, FIG. 1 illustrates a magnetoresistive head for reading data from a magnetic recording medium. The head comprises a GMR sensing element 10, a magnetic bias field source 12, and a resistance detecting circuit 14 disposed on a glass substrate 16. One end of the GMR sensing element 10 is flush with one side 17 of the substrate 16. During the reading of data, this side 17 of the substrate 16 is brought into close proximity to a magnetic recording medium, so that the GMR sensing element 10 is disposed within magnetic leakage fields produced by data recorded on the magnetic recording medium.

The magnetic bias field source 12 comprises an alternating-current source 19 and a solenoid 20. During the reading of data, the alternating-current source 19 feeds alternating current 'i' to the solenoid 20, causing the solenoid 20 to generate an alternating magnetic bias field. The solenoid 20 is disposed adjacent the GMR sensing element 10, so that the GMR sensing element 10 is positioned within the bias field generated by the solenoid 20. The operation of the alternating-current source 19 is synchronized with a clock signal 'clk' supplied by external signal-processing circuitry (not shown).

The resistance detecting circuit 14 feeds current through the GMR sensing element 10 by means of a pair of copper electrodes 21, to which the resistance detecting circuit 14 is coupled by electrically conductive lines 'p' and 'q.' Changes in the electrical resistance of the GMR sensing element 10 cause corresponding changes in the current flow and/or the voltage drop across the GMR sensing element 10. Well-known circuitry in the resistance detecting circuit 14 detects these changes and generates an output signal $v_{out}$.

Figure 2:
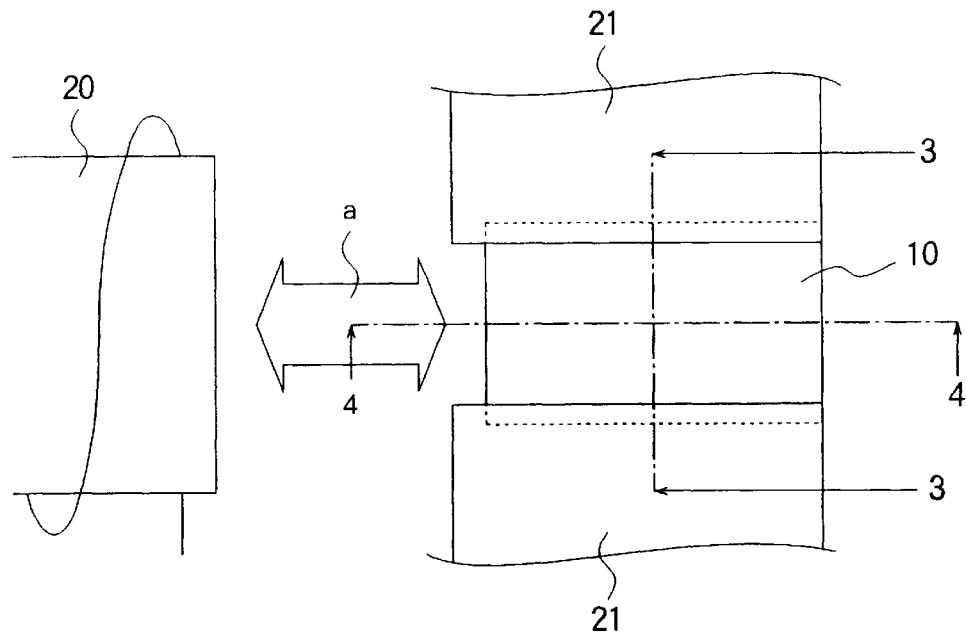
FIG. 2 is an enlarged plan view of the GMR sensing element in FIG. 1.

FIG. 2 shoves an enlarged plan view of the GMR sensing element 10 and its surrounding vicinity. The GMR sensing element 10 has the form of a rectangle fifty micrometers (50 $\mu$m) long and thirty micrometers (30 $\mu$m) wide. Each electrode 21 makes contact with one of the long sides of the GMR sensing element 10, for the full length of the side. The double-headed arrow 'a' represents the alternating magnetic field generated by the solenoid 20. Ferromagnetic layers (described below) in the GMR sensing element 10 have easy magnetization directions oriented parallel to the long axis of the GMR sensing element 10, thus parallel to arrow 'a.'

Various internal structures are possible for the GMR sensing element 10. One possible structure is illustrated in FIG. 3, which shows a sectional view through line 3—3 in FIG. 2, and FIGS. 4 and 5, which show sectional views through line 4—4 in FIG. 2.

Figure 3:
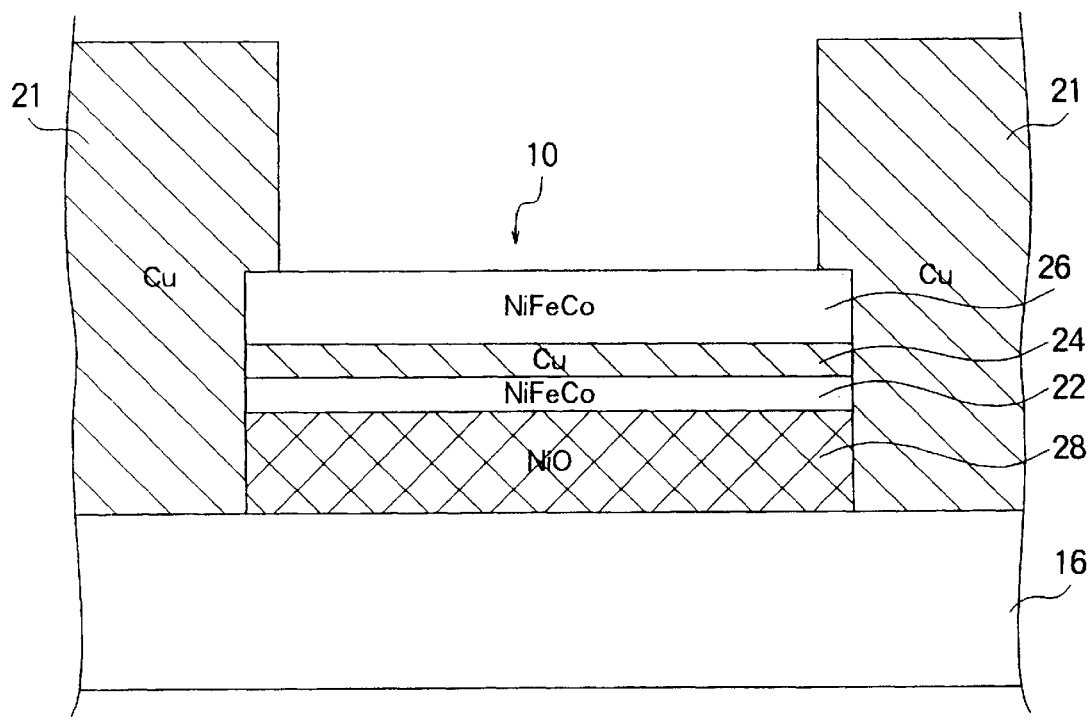
FIG. 3 is a sectional view through line 3—3 in FIG. 2.

Referring to FIG. 3, the GMR sensing element 10 comprises a first ferromagnetic layer 22, a nonmagnetic layer 24, a second ferromagnetic layer 26, and an antiferromagnetic layer 28. The nonmagnetic layer 24 is disposed between the two ferromagnetic layers 22 and 26. The antiferromagnetic layer 28 is disposed between the first ferromagnetic layer 22 and the substrate 16. The antiferromagnetic layer 28 is a film of nickel oxide (NiO) twenty-seven nanometers (27.0 nm) thick. The first ferromagnetic layer 22 is a nickel-iron-cobalt ($Ni_{35}Fe_{20}Co_{45}$) film 2.0 nm thick. The nonmagnetic layer 24 is a copper (Cu) film 2.0 nm thick. The second ferromagnetic layer 26 is another $Ni_{35}Fe_{20}Co_{45}$ film 10.0 nm thick. These films are deposited on the substrate 16 by sputtering and are patterned by photolithography, after which the electrodes 21 are deposited and patterned. The electrodes 21 comprise copper films 1.0 $\mu$m thick.

Another possible structure has the same four layers 22, 24, 26, and 28 disposed in the reverse order, so that the second ferromagnetic layer 26 is adjacent the substrate 16. Yet another possible structure repeats the basic four-layer unit shown in FIG. 3 multiple times.

Figure 4:
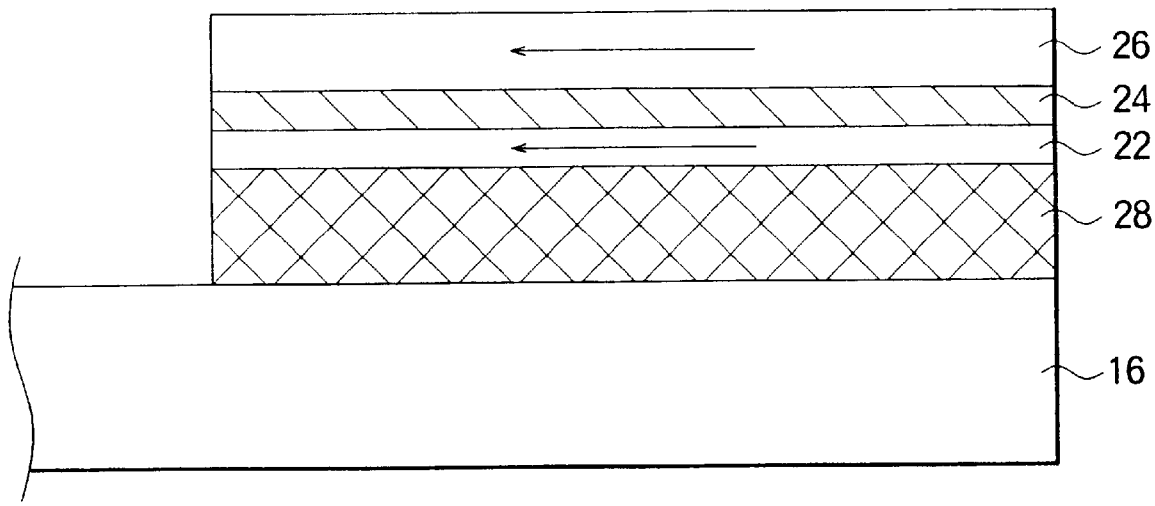
FIG. 4 is a sectional view through line 4—4 in FIG. 2, illustrating the parallel magnetization state.

In any of these structures, when the GMR sensing element 10 is fabricated, a strong external magnetizing field is applied parallel to the long axis or easy magnetization axis of the GMR sensing element 10. The two ferromagnetic layers 22 and 26 are thereby both magnetized in the same direction, as shown in FIG. 4. The electrical resistance of the GMR sensing element 10 is lowest in this parallel magnetization state.

After the strong external field is removed, the magnetization of the first ferromagnetic layer 22 remains pinned by a bias field generated by exchange coupling with the adjacent antiferromagnetic layer 28. The second ferromagnetic layer 26, being separated from the antiferromagnetic layer 28 by the first ferromagnetic layer 22 and nonmagnetic layer 24, is not as strongly affected by this exchange bias field, and the nonmagnetic layer 24 prevents exchange coupling between the first ferromagnetic layer 22 and second ferromagnetic layer 26. The magnetization of the second ferromagnetic layer 26 can therefore be altered by an external field that would not be strong enough to alter the magnetization of the first ferromagnetic layer 22.

Figure 5:
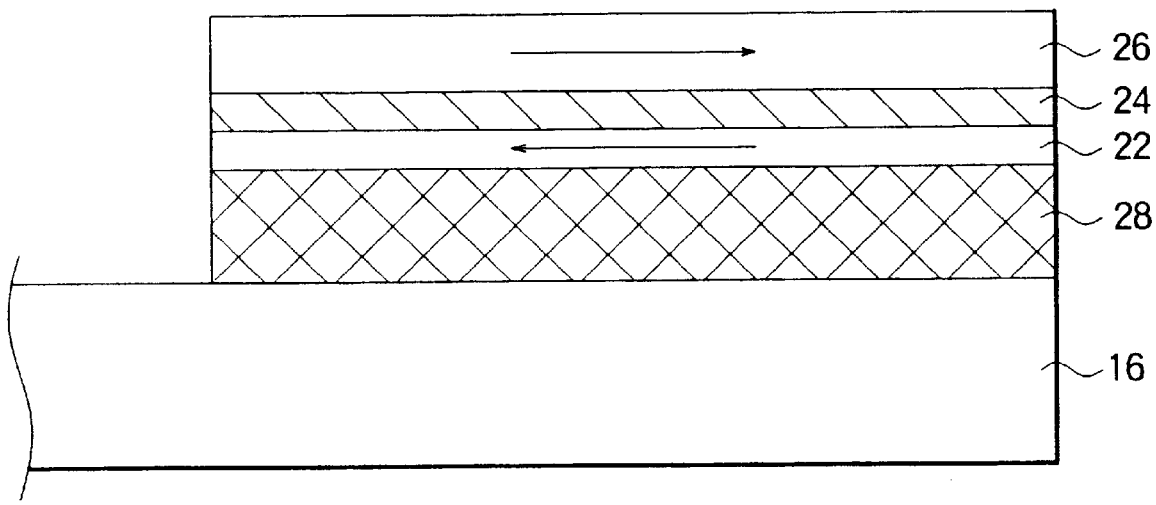
FIG. 5 is another sectional view through line 4—4 in FIG. 2, illustrating the antiparallel magnetization state.

In particular, if an external magnetic field of moderate strength is applied in the opposite direction to the direction shown in FIG. 4, the magnetization of the second ferromagnetic layer 26 may flip over while the magnetization of the first ferromagnetic layer 22 remains pinned. The two ferromagnetic layers are then magnetized in mutually opposite directions, as shown in FIG. 5. The electrical resistance of the GMR sensing element 10 is highest in this antiparallel magnetization state.

Figure 6:
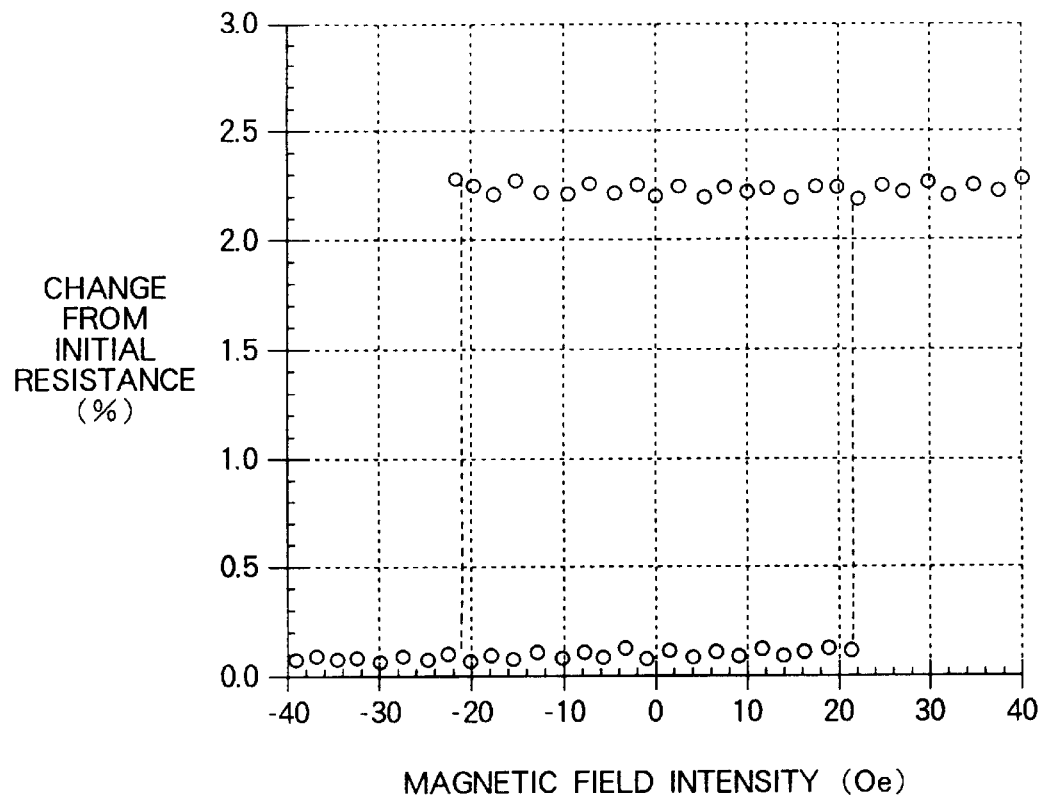
FIG. 6 is a graph illustrating the magnetoresistance characteristic of the GMR sensing element in FIGS. 3 to 5.

FIG. 6 shows data obtained by the inventors to evaluate the magnetoresistive performance of the GMR sensing element 10 in FIGS. 3 to 5. The horizontal axis indicates external magnetic field intensity in oersteds (Oe) parallel to the long axis of the GMR sensing element 10, the positive and negative signs indicating opposite directions parallel to this axis. The vertical axis represents the variation in electrical resistance of the GMR sensing element 10 in percent. Initially, an external field of minus five hundred oersteds (−500 Oe) was applied, magnetizing both ferromagnetic layers 22 and 26 in the same direction. The electrical resistance in this initial parallel magnetization state corresponds to 0.0% on the vertical scale.

The electrical resistance was then monitored as an alternating magnetic field with peak values of plus and minus forty oersteds was applied. The electrical resistance was observed to follow a hysteresis loop, increasing abruptly to a value about 2.3% higher than the initial value at a field strength of substantially twenty-two oersteds (22 Oe), and decreasing abruptly to a value substantially equal to the initial value at a field strength of substantially minus twenty-one oersteds (−21 Oe). These abrupt changes indicate the points at which the magnetization of the second ferromagnetic layer 26 reversed between the parallel and antiparallel states. The lower resistance value was actually about 0.1% higher than the initial value, due to measurement noise.

Figure 7:
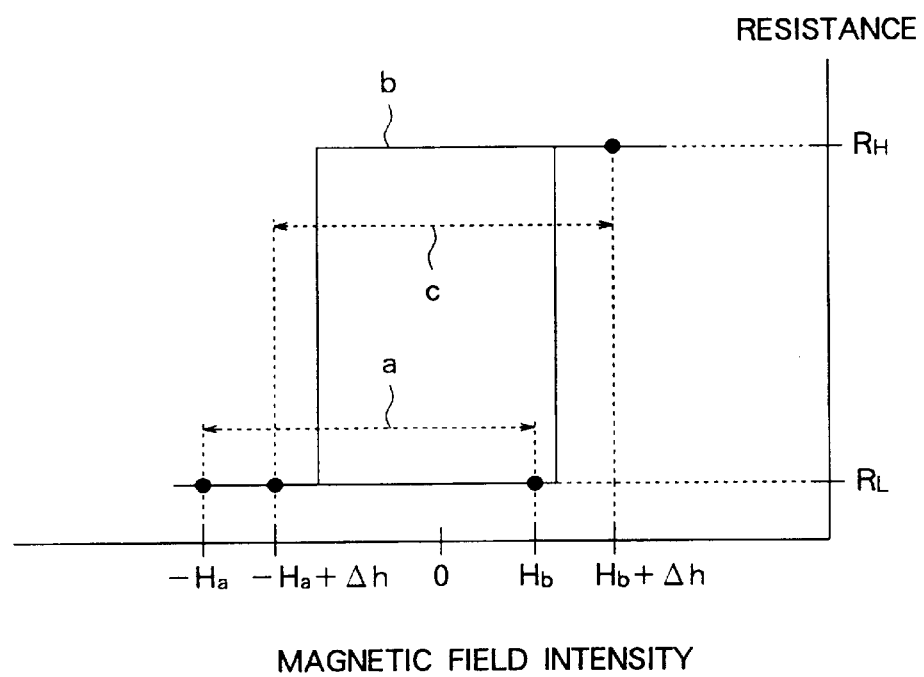
FIG. 7 is a graph illustrating the operation of the first embodiment.

FIG. 7 illustrates the principle of operation of the first embodiment. As in FIG. 6, the horizontal axis indicates magnetic field intensity parallel to the long axis of the GMR sensing element 10, and the vertical axis indicates the resulting electrical resistance of the GMR sensing element 10. $R_H$ indicates the relatively high resistance value obtained in the antiparallel magnetization state. $R_L$ indicates the lower resistance value obtained in the parallel magnetization state. The dashed arrow marked 'a' indicates the alternating bias field generated by the magnetic bias field source 12. The line marked 'b' represents the magnetoresistance characteristic of the GMR sensing element 10.

The bias field generated by the magnetic bias field source 12 alternates between a negative value $-H_a$ such as minus thirty oersteds (−30 Oe) outside the hysteresis loop of the magnetoresistance curve, and a positive value $H_b$ such as twenty-one oersteds (21 Oe) disposed inside the hysteresis loop, close to the upward transition point of the hysteresis loop. In the absence of any other magnetic field, the negative bias value $(-H_a)$ brings the second ferromagnetic layer 26 into the parallel magnetization state, and the positive bias value $(H_b)$ is inadequate to alter the magnetization of the second ferromagnetic layer 26 to the antiparallel state. The resistance of the GMR sensing element 10 therefore remains at the relatively low level $(R_L)$.

If a positive external magnetic field of intensity Δh is also applied, however, the GMR sensing element 10 experiences a net magnetic field that alternates between values of $-H_a+\Delta h$ and $H_b+\Delta h$, as indicated by the dashed arrow marked 'c.' If the external field intensity Δh is sufficiently large, then HQ +Δh is disposed to the right of the hysteresis loop, causing the second ferromagnetic layer 26 in the GMR sensing element 10 to assume the antiparallel magnetization state and the resistance of the GMR sensing element 10 to rise to the higher level $(R_H)$. With the above values of twenty-one oersteds for $H_b$ and twenty-two oersteds for the upward transition point of the hysteresis loop, the external field Intensity Δh need be only about two oersteds (2 Oe) to cause a change in resistance from $R_L$ to $R_H$.

FIGS. 8a to 8a illustrate the operation of the first embodiment in reading data from a magnetic recording medium 32 such as a magnetic tape or disk. For simplicity, only the substrate 16 and GMR sensing element 10 of the magnetoresistive head are shown in FIG. 8a. The side of the substrate 16 at which the GMR sensing element 10 is disposed is brought close to the surface 33 of the magnetic recording medium 32, and a relative motion 34 is produced, either by moving the magnetoresistive head or by moving the magnetic recording medium 32.

Data are recorded on the magnetic recording medium 32 by longitudinal magnetization of regions 36, as indicated by the arrows. At the boundaries between differently magnetized regions 36, the leakage field from the magnetic recording medium 32 is oriented parallel to the long axis of the GMR sensing element 10 (vertically in the drawing). A positive leakage field (Δh) is produced at boundaries of one polarity, represented by convergent magnetization arrows in the drawing; a negative leakage field (−ΔH) is produced at boundaries of the opposite polarity, represented by divergent magnetization arrows. At other points, the leakage field is oriented substantially parallel to the surface 33 of the magnetic recording medium 32, thus perpendicular to the long axis of the GMR sensing element 10. A data encoding scheme is used in which one binary value (e.g. '1') is represented by the presence of a boundary producing a positive leakage field, and another binary value (e.g. '0') is represented by the absence of such a boundary.

The first waveform shown below the magnetic recording medium 32 is that of the clock signal 'clk' (FIG. 8b). The clock signal alternates between high (H) and low (L) voltage levels at a frequency matched to the speed of relative motion 34, so that one period of the clock signal corresponds to the length of one region 36. The phase of the clock signal is locked to the phase of the output signal from the magnetoresistive head, so that positive clock pulses occur at the boundaries between regions 36.

The next waveform 'a' (FIG. 8c) is that of the alternating magnetic bias field generated by the magnetic bias field source 12. The operation of the magnetic bias field source 12 is synchronized to the clock signal so that the bias field is positive $(H_b)$ at the boundaries between regions 36, and negative $(-H_a)$ at the centers of the regions 36. The bias field has a substantially square waveform.

The last waveform 'd' (FIG. 8d) indicates the resistance of the GMR sensing element 10. Normally, the GMR sensing element 10 is in the parallel magnetization state, and the resistance value is comparatively low ($R_L$). At boundaries producing a positive leakage field, however, the combined intensity ($H_b+\Delta H$) of the leakage field ($\Delta H$) and the bias field ($H_b$) is sufficient to flip the magnetization of the second ferromagnetic layer 26 into the antiparallel state, and the resistance value rises promptly to $R_H$. Just past the boundary, the leakage field becomes perpendicular to the long axis of the GMR sensing element 10, while the magnetic bias field source 12 continues to produce a bias field oriented parallel to the long axis. The bias field ($H_b$), being stronger than the leakage field, and being oriented parallel to the easy direction of magnetization of the second ferromagnetic layer 26, continues to hold the second ferromagnetic layer 26 in the antiparallel state. When the bias field changes to the negative value ($-H_a$), the second ferromagnetic layer 26 is forced to return to the parallel magnetization state, and the resistance of the GMR sensing element 10 returns to the lower value ($R_L$).

In short, the resistance of the GMR sensing element 10 rises at each magnetic boundary producing a positive leakage field, remains high for a duration determined by the waveform of the alternating magnetic bias field, then returns to the low level. The resistance detecting circuit 14 detects these resistance changes and outputs a corresponding signal, from which the data recorded on the magnetic recording medium 32 can be recovered.

One advantage of the first embodiment is its greatly improved sensitivity. A conventional magnetoresistive head employing the same type of GMR sensing element 10 would require a leakage field intensity exceeding twenty-two oersteds to switch the magnetization of the second ferromagnetic layer 26 into the antiparallel state. With the first embodiment, a field intensity of only two oersteds suffices; the sensitivity is improved by an order of magnitude. The improved sensitivity enables the data recording density to be increased.

This improvement is obtained from the use of the alternating magnetic bias field, and does not depend on the specific materials in the GMR sensing element 10. Similar improvements could be obtained by using other alloys of iron, nickel, and cobalt in the ferromagnetic layers 22 and 26, or using one of these metals in an unalloyed form. For the antiferromagnetic layer 28 there are also various other possible materials, such as nickel-manganese (NiMn) iridium-manganese (IrMn), iron-manganese (FeMn), cobalt oxide (CoO), and amorphous ferric oxide ($Fe_2O_3$)

Another advantage of the first embodiment is that the pulse width of the resistance waveform 'd' in FIG. 8d depends on the waveform of the alternating magnetic bias field 'a', rather than the shape of the leakage field from the data recording medium. The waveform of the alternating bias field can be designed to produce an easily readable output signal, regardless of the magnetic properties of the recording medium.

In this regard, the magnetic bias field waveform is not limited to the square wave shown in FIG. 8c. Other types of waveforms, such as triangular waveforms and sine waveforms, for example, can be employed instead.

Incidentally, the phase lock of the clock signal 'clk' can be maintained by conventional clock recovery methods. Initial phase lock can be acquired by holding the alternating bias field at the positive value $H_b$ until the first resistance transition is detected.

Next, a second embodiment will be described. The second embodiment is also a magnetoresistive head with the general structure shown in FIG. 1, differing from the first embodiment in the internal structure of the GMR sensing element.

Referring to FIG. 9, the GMR sensing element 38 in the second embodiment comprises a plurality of multilayer films 40a, 40b, . . . , 40f deposited one over another on the substrate 16. Six such multilayer films are shown in the drawing, but there may be an arbitrary number. All of the multilayer films have identical internal layer structures.

Figure 10:
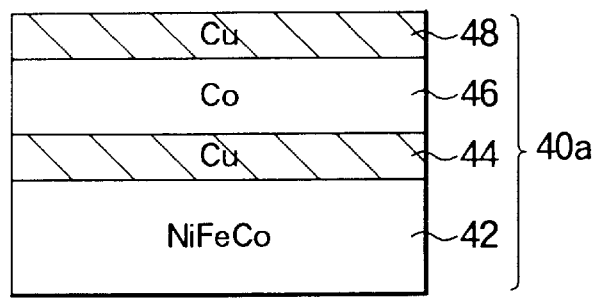
FIG. 10 an enlarged sectional view of one of the multi-layer films in FIG. 9.

As an example, FIG. 10 shows the layer structure of multilayer film 40a, comprising a second ferromagnetic layer 42, a non-magnetic layer 44, a first ferromagnetic layer 46, and another non-magnetic layer 48. The two non-magnetic layers 44 and 48 are copper (Cu) films 2.8 nm thick. The second ferromagnetic layer 42 is a $Ni_{35}Fe_{20}Co_{45}$ film 10.0 nm thick. The first ferromagnetic layer 46 is a cobalt (Co) film 6.0 nm thick. A feature of this structure is that the first ferromagnetic layer 46 has a higher coercivity than the second ferromagnetic layer 42.

The above films are deposited by sputtering, then patterned by photolithography to give the GMR sensing element 38 the same dimensions (50 $\mu$m×30 $\mu$m) as in the first embodiment.

Figure 11:
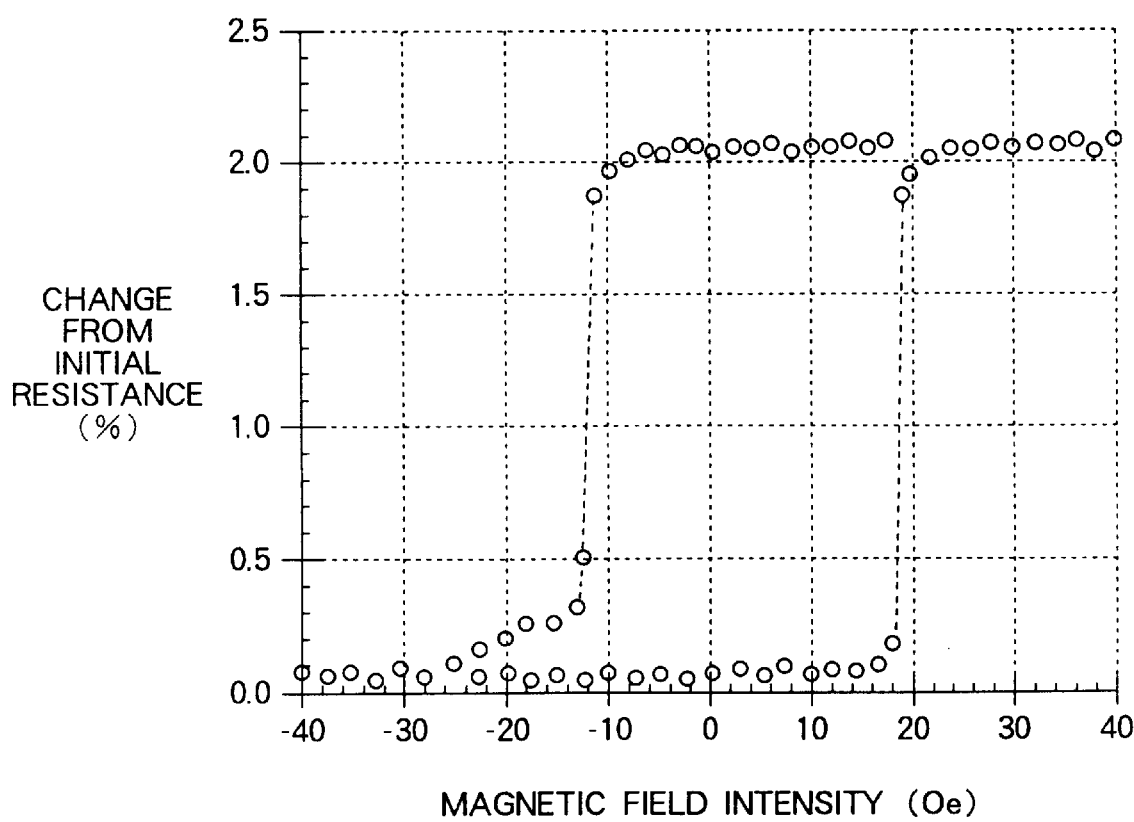
FIG. 11 is a graph illustrating the magnetoresistance characteristic of the GMR sensing element in FIGS. 9 and 10.

FIG. 11 shows magnetoresistance data obtained by the inventors for the GMR sensing element 38 in the second embodiment. The horizontal axis represents the magnetic field intensity and the vertical axis represents electrical resistance relative to an initial value, as in FIG. 6. A magnetic field of minus five hundred oersteds (-500 Oe) was initially applied to magnetize both ferromagnetic layers 42 and 46 in the same direction, then an alternating magnetic field cycling between plus and minus forty oersteds (-40 Oe to +40 Oe) was applied and the change in resistance was measured. A hysteresis loop was again observed, indicating that the second ferromagnetic layers 42 were reversing between the parallel and antiparallel magnetization states, while the first ferromagnetic layers 46 were held pinned in their initial magnetization state by their higher coercivity. The upward transition of the hysteresis loop occurred at substantially nineteen oersteds (19 Oe), and the downward transition at substantially minus thirteen oersteds (-13 Oe) The upper resistance value in the hysteresis loop was substantially 2.2% greater than the initial resistance value, while the lower value was substantially equal to (only 0.1% greater than) the initial value.

The principle of operation of the second embodiment is the same as in the first embodiment, as illustrated in FIGS. 7 and 8. If the bias field generated by the magnetic bias field source 12 alternates between values of, for example, minus thirty oersteds (-30 Oe) and plus eighteen oersteds (18 Oe), then data can be read with an external field intensity of only about plus two oersteds (2 Oe), as in the first embodiment.

This compares with an external field intensity of more than nineteen oersteds that would be required in a conventional magnetoresistive head employing the GMR sensing element 38 of the second embodiment. Sensitivity is again increased by an order of magnitude over the prior art.

An advantage of the second embodiment is that the GMR sensing element 38 can be more easily fabricated, insofar as no antiferromagnetic layer is required.

Next, a third embodiment will be described. The third embodiment is also a magnetoresistive head.

Figure 12:
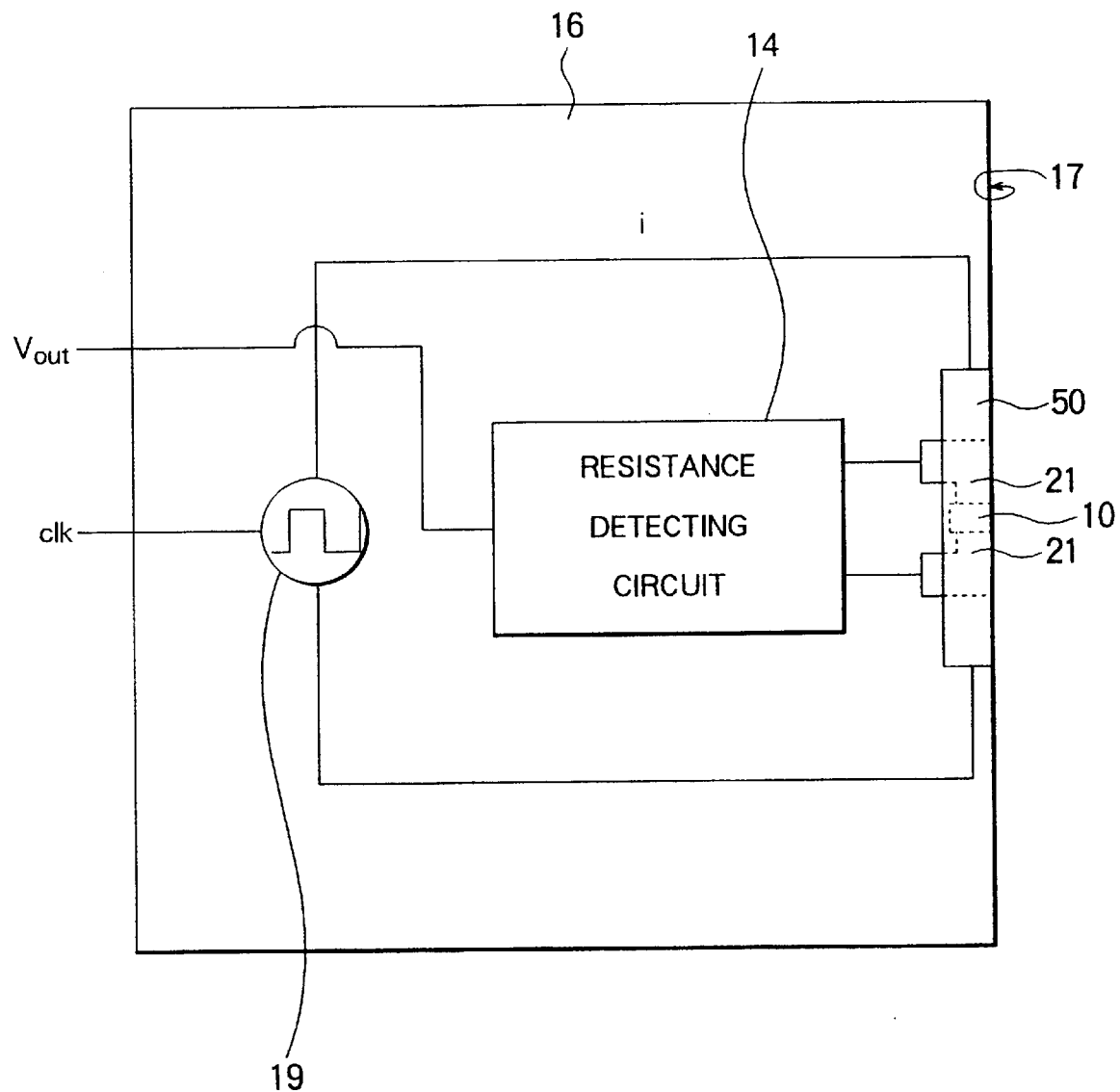
FIG. 12 is a schematic plan view of a magnetoresistive head illustrating a third embodiment of the invention.

Referring to FIG. 12, the third embodiment replaces the solenoid of the first embodiment with a conductive film 50 that extends along at least part of the side 17 of the substrate 16, covering the GMR sensing element 10. The alternating-current source 19 feeds alternating current 'i' through the conductive film 50, thereby generating an alternating magnetic field that biases the GMR sensing element 10. The biasing magnetic field is oriented in a direction perpendicular to the direction of current flow.

Figure 13:
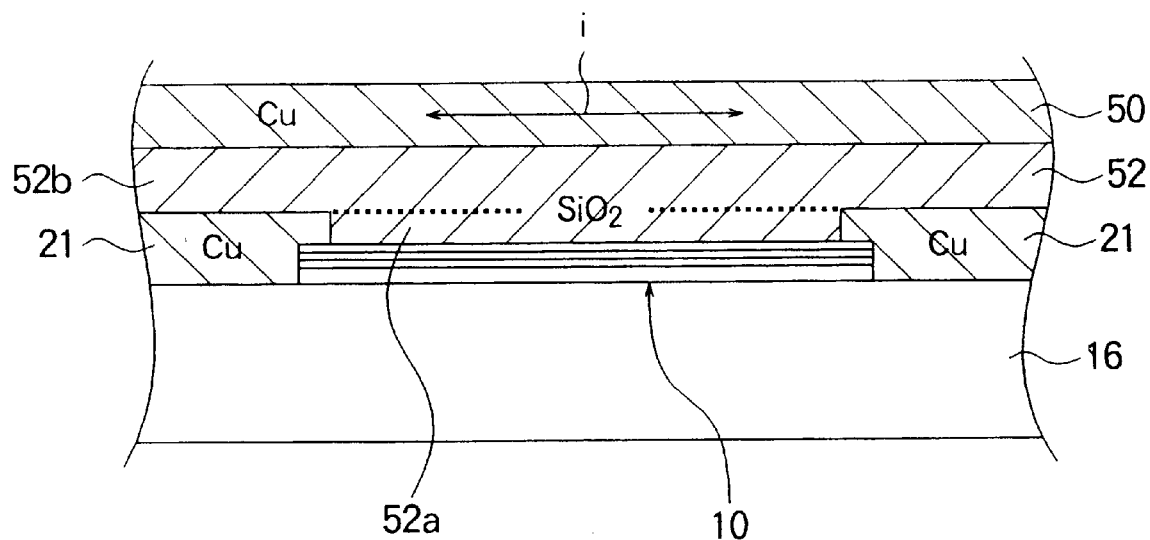
FIG. 13 is a sectional view through the center of the GMR sensing element in FIG. 12, parallel to the adjacent edge of the substrate.

FIG. 13 shows a sectional view through the center of the GMR sensing element 10, parallel to the adjacent side 17 of the substrate 16. The GMR sensing element 10 and electrodes 21 are covered with a dielectric film 52 of silicon dioxide ($SiO_2$) substantially 1 µm thick. The conductive film 50 comprises a layer of copper (Cu) substantially 1 µm thick. The conductive film 50 and dielectric film 52 are deposited by sputtering and patterned by photolithography. The double-headed arrow 'i' indicates the flow of alternating current in the conductive film 50.

Figure 14:
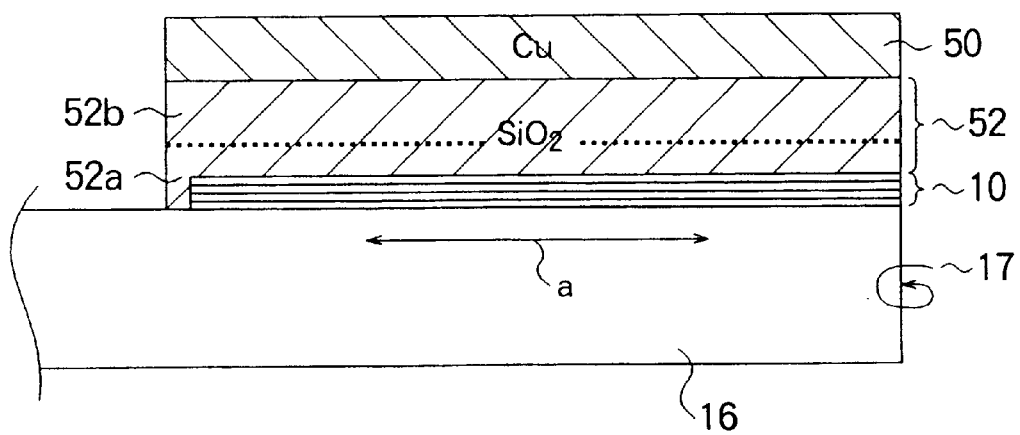
FIG. 14 is a sectional view through the center of the GMR sensing element in FIG. 12, perpendicular to the adjacent edge of the substrate.

FIG. 14 shows a sectional view through the center of the GMR sensing element 10 perpendicular to the adjacent side 17 of the substrate, thus perpendicular to the view in FIG. 13. The double-headed arrow 'a' indicates the orientation of the alternating magnetic bias field generated by the flow of alternating current in the conductive film 50.

The third embodiment can be fabricated by depositing the dielectric film 52 as a single layer, after the electrodes 21 have been deposited and patterned. Alternatively, the dielectric film 52 can be deposited in two layers, as indicated by the dashed line in FIGS. 13 and 14. The lower layer 52a is deposited before the electrodes 21, and is patterned to dimensions slightly longer and narrower than the dimensions of the GMR sensing element 10. The electrodes 21 can then be deposited in a self-aligned manner. After the electrodes 21 have been patterned, the upper layer 52b of the dielectric film 52 is deposited, covering both the lower layer 52a and the electrodes 21.

The third embodiment operates in the same way as the first and second embodiments, as illustrated in FIGS. 7 and 8. An advantage of the third embodiment is that the conductive film 50 is smaller, lighter, and easier to fabricate than the solenoid employed in the first embodiment. The third embodiment thus provides a magnetoresistive head that is smaller, lighter, and less expensive than the magnetoresistive head of the first embodiment.

Figure 15:
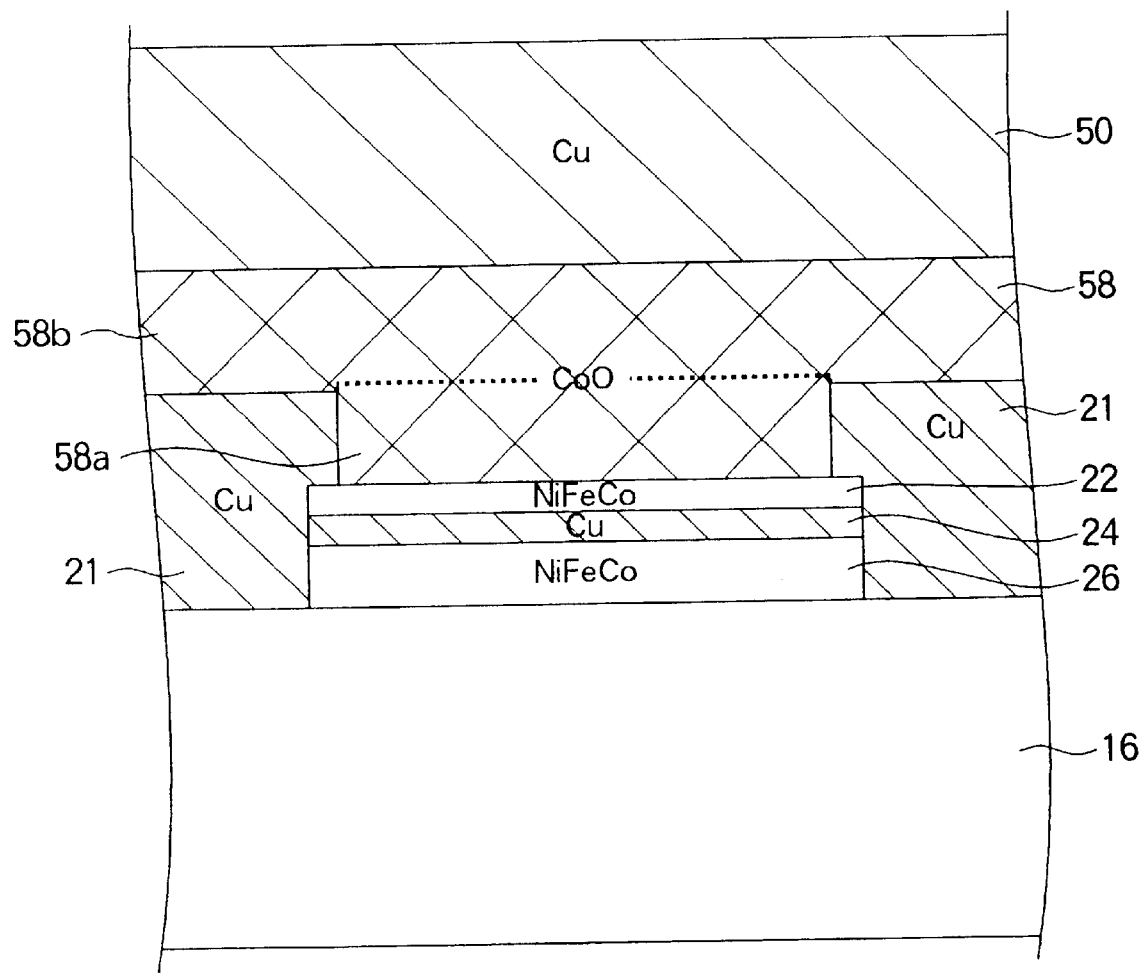
FIG. 15 is a sectional view through the center of the GMR sensing element in FIG. 12, parallel to the adjacent edge of the substrate, illustrating a variation of the third embodiment.

FIG. 15 is a sectional view similar to FIG. 13, with vertical dimensions greatly exaggerated for clarity, illustrating a variation of the third embodiment. In this variation, the antiferromagnetic layer 58 of the GMR element is also the dielectric layer that separates the conductive film 50 from the electrodes 21. The antiferromagnetic layer 58 comprises a dielectric material such as cobalt oxide (CoO), as shown in the drawing, nickel oxide (NiO), or amorphous ferric oxide ($Fe_2O_3$). The second ferromagnetic layer 26 is deposited first, followed by the nonmagnetic layer 24, the first ferromagnetic layer 22, then the electrodes 21 and dielectric antiferromagnetic layer 58.

The dielectric antiferromagnetic layer 58 may be deposited as a single layer after the electrodes 21 have been formed, or as two layers, the lower layer 58a being deposited before the electrodes 21, and the upper layer 58b after the electrodes 21. In the latter case, only the lower layer 58a has to be antiferromagnetic. The upper layer 58b may comprise another dielectric material, such as silicon dioxide.

The variation shown in FIG. 15 has the advantage of reducing the number of separate layers that have to be deposited and patterned.

As another variation of the third embodiment, the GMR sensing element 10 in FIGS. 13 and 14 can be replaced by the GMR sensing element 38 of the second embodiment, having the structure shown in FIGS. 9 and 10.

Figure 16:
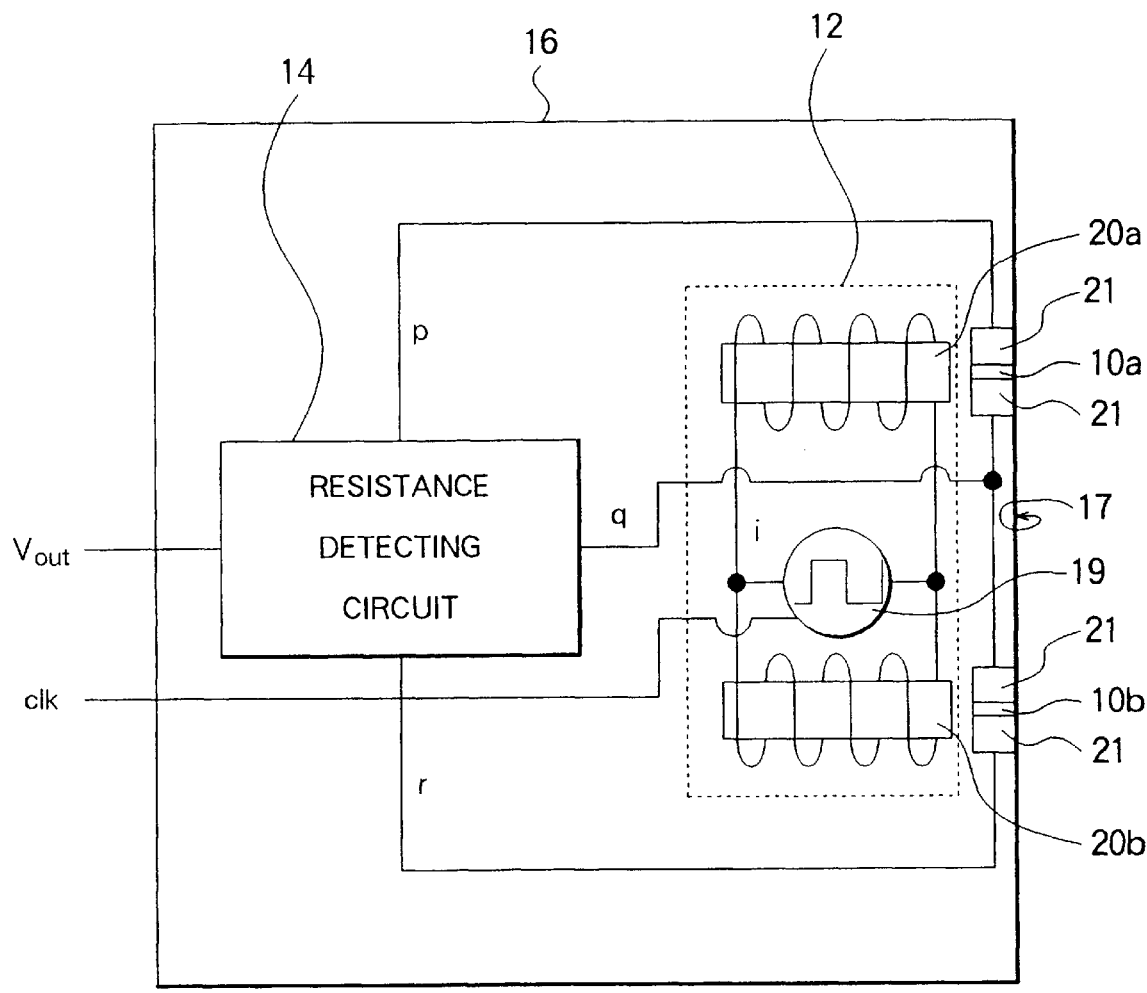
FIG. 16 is a schematic plan view of a magnetoresistive head illustrating a fourth embodiment of the invention.

As a fourth embodiment of the invention, FIG. 16 shows a magnetoresistive head having two GMR sensing elements 10a and 10b with respective electrodes 21. Both GMR sensing elements 10a and 10b have the structure described in the first embodiment.

The magnetic bias field source 12 in the second embodiment comprises two solenoids 20a and 20b coupled to a common alternating-current source 19. The first solenoid 2a generates an alternating magnetic bias fields for the first GMR sensing element 10a. The second solenoid 20b generates an alternating magnetic bias fields for the second GMR sensing element 10b. The solenoids 20a and 20b are wound oppositely, the winding of the first solenoid 20a being clockwise as viewed from the adjacent side 17 of the substrate 16, the winding of the second solenoid 20b being counterclockwise as viewed from this side 17. Accordingly, when the current 'i' in solenoid 20a generates a magnetic bias field oriented in one direction, the current in solenoid 20b generates a magnetic bias field oriented in the opposite direction.

The resistance detecting circuit 14 is coupled to the GMR sensing elements 10a and 10b by three conductive lines 'p,' 'q,' and 'r.' Current fed to the first GMR sensing element 10a through line 'p' returns through line 'q.' Current fed to the second GMR sensing element 10b through line 'r' also returns through line 'a.'

Figure 17:
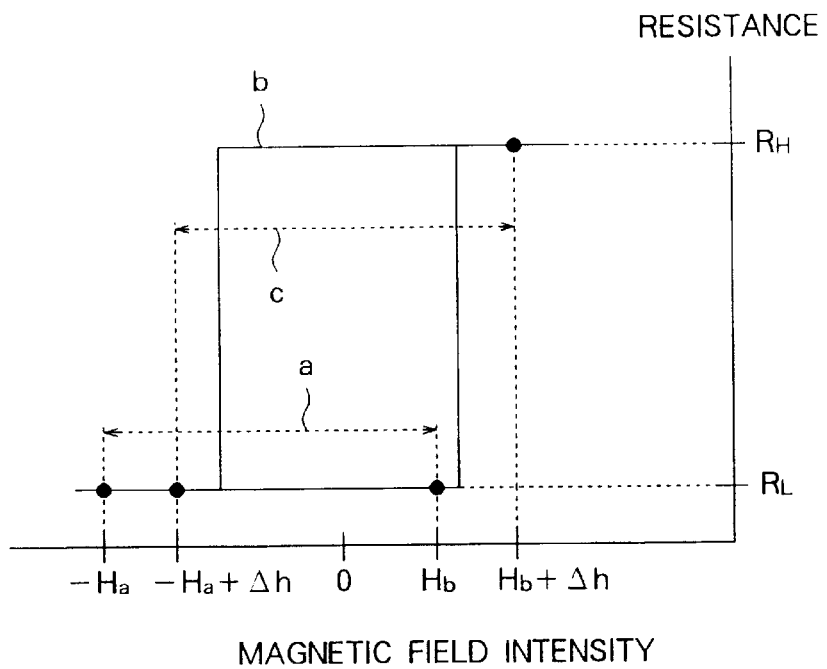
FIGS. 17 and 18 are graphs illustrating the operation of the fourth embodiment.

FIG. 17 illustrates the operation of the first GMR sensing element 10a, showing magnetic field intensity on the horizontal axis and electrical resistance on the vertical axis. The bias field 'a' generated by solenoid 20a alternates between the same values $-H_a$ and $H_b$ as in the first embodiment. The magnetoresistance characteristic 'b' of the GMR sensing element 10a is also the same as in the first embodiment. If an appropriate positive external magnetic field $\Delta h$ is added to the alternating bias field 'a,' the net field 'c' alternates between values of $-H_a+\Delta h$ and $H_b+\Delta h$, and switches the GMR sensing element 10a between the low-resistance ($R_L$) and high-resistance ($R_H$) states.

Figure 18:
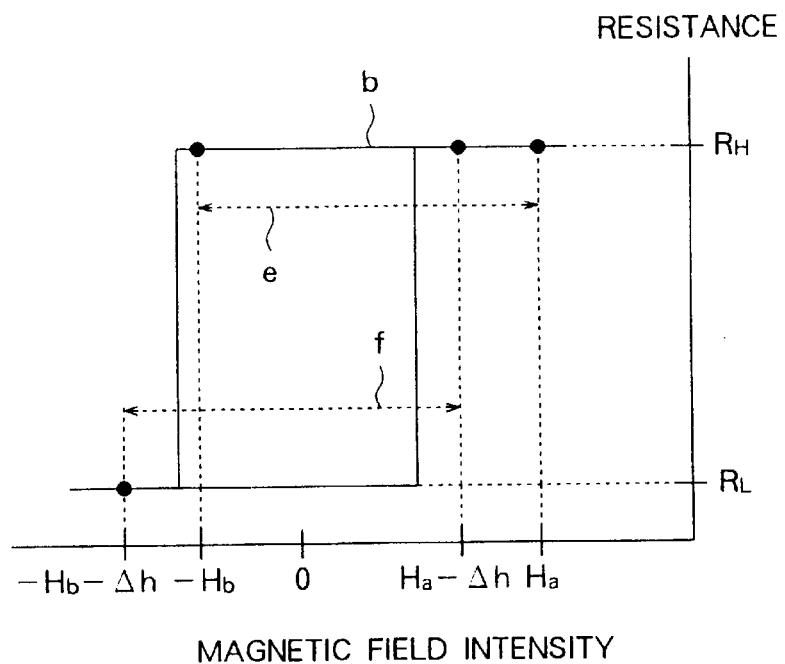

FIG. 18 similarly illustrates the operation of the second GMR sensing element 10b, which has the same magnetoresistance characteristic 'b' as the first GMR sensing element 10a. Due to the opposite winding of solenoid 20b, the magnetic bias field 'e' alternates between values of $H_a$ and $-H_b$. The $H_a$ bias, being disposed to the right of the upward transition in the magnetoresistive characteristic, forces the GMR sensing element 10b into the high-resistance antiparallel state ($R_H$) The $-H_b$ bias, being disposed to the right of the downward transition in the magnetoresistive characteristic, is too weak to switch the GMR sensing element 10b into the low-resistance parallel state. Thus in the absence of an external field, the second GMR sensing element 10b is held in the high-resistance state ($R_H$) If an appropriate negative external field $-\Delta h$ is added, the net magnetic field 'f' alternates between $H_a-\Delta h$, which is disposed to the right of the upward transition in the magnetoresistive characteristic 'b,' and $-H_a-\Delta h$, which is now disposed to the left of the downward transition in the magnetoresistive characteristic. This net field 'f' accordingly switches GMR sensing element 10b between the low-resistance ($R_L$) and high-resistance (Ray states.

Figure 19:
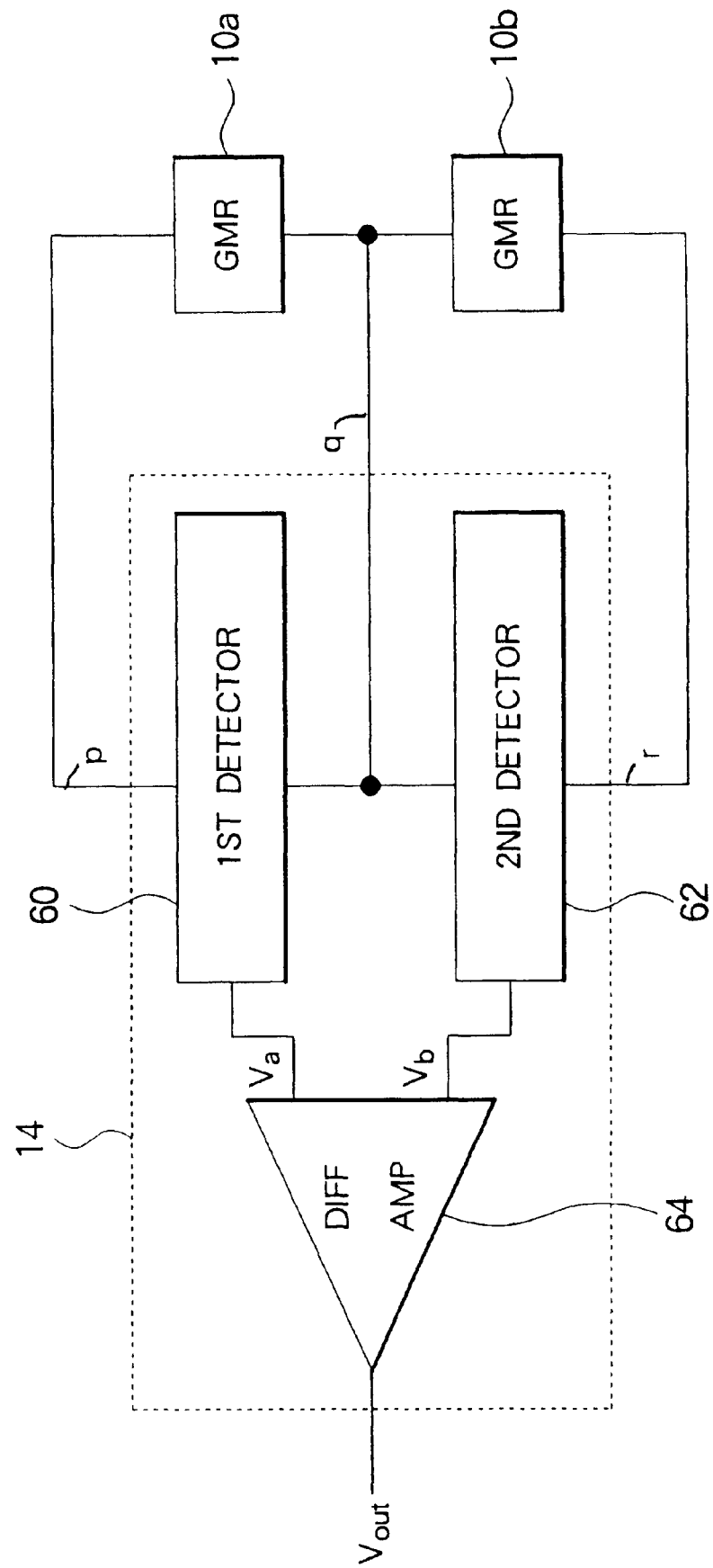
FIG. 19 is a block diagram illustrating the internal structure of the resistance detecting circuit in the fourth embodiment.
Figure 22A:
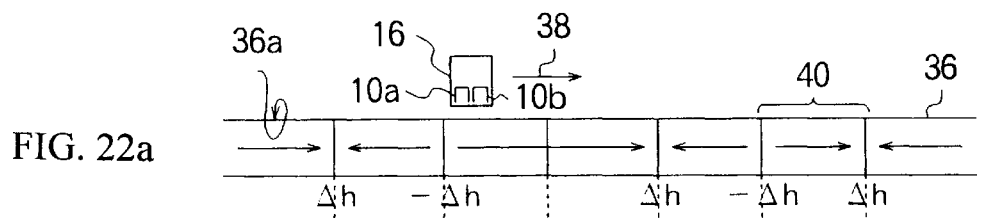

FIG. 19 shows the internal structure of the resistance detecting circuit 14 in the fourth embodiment. Conductive lines 'p' and 'q' are coupled to a first detector 60 that detects the electrical resistance of the first GMR sensing element 10a and outputs a corresponding signal $v_a$. Conductive lines 'r' and 'q' are coupled to an identical second detector 62 that detects the electrical resistance of the second GMR sensing element 10b and outputs a corresponding signal $v_b$. These two signals $v_a$ and $v_b$ are furnished to a difference amplifier 64, which amplifies their difference to obtain the output signal $v_{out}$.

FIGS. 20a to 20b illustrate the operation of the fourth embodiment in reading data from the same magnetic recording medium 32 as in the first embodiment. Referring to FIG. 20a, the substrate 16 is placed so that both GMR sensing elements 10a and 10b are near the surface 33 of the recording medium 32, and a relative motion 34 is produced as in the first embodiment.

The first three waveforms FIGS. 20b, 20c and 20d respectively are the clock waveform 'clk', the waveform of the alternating bias field 'a' generated by the first solenoid 20a, and the resistance waveform of the first GMR sensing element 10a. These waveforms are identical to the corresponding waveforms in the first embodiment, positive pulses of the resistance waveform 'd' coinciding with magnetic transitions in the recording medium 32 that produce a positive leakage field Δh.

The next two waveforms illustrate the alternating bias field 'e' generated by the second solenoid 20b, and the resistance waveform 'f' of the second GMR sensing element 10b. The waveform of bias field 'e'(FIG. 20e) is complementary to the waveform of bias field (FIG. 20a). As described above, GMR sensing element 10b is normally in the high-resistance state ($R_H$), but changes to the low-resistance state ($R_L$) when a negative leakage field (−Δh) is superimposed on a negative bias field (−$H_b$). Resistance waveform 'g' (FIG. 20f) thus has negative pulses coinciding with magnetic transitions in the recording medium 32 that produce a negative leakage field −Δh.

The last waveform in FIG. 20 illustrates the output $v_{out}$ of the resistance detecting circuit 14. Since the output waveform is obtained by subtracting the output of the second detector 62 from the output of the first detector 60 in the resistance detecting circuit 14, $v_{out}$ takes on two values, shown as '0' and '1' in FIG. 20. The '0' state indicates non-transition locations, when the first GMR sensing element 10a is in the low-resistance state and the second GMR sensing element 10b is in the high-resistance state. The '1' state indicates the presence of a magnetic transition, which temporarily places GMR sensing elements 10a and 10b both in the high-resistance state, or both in the low-resistance state.

Whereas the output signal in the first embodiment indicated only magnetic transitions producing positive leakage fields (Δh), the output signal in the fourth embodiment indicates both magnetic transitions producing positive leakage fields (Δh) and magnetic transitions producing negative leakage fields (−Δh). The fourth embodiment is suitable for use with data recording schemes in which, for example, a binary '1' is indicated by the presence of a magnetic transition, and a binary '0' by the absence of a magnetic transition. Higher recording densities are possible than in the first embodiment, because both positive and negative magnetic transitions are detected.

FIG. 21 illustrates a variation of the fourth embodiment in which the resistance detecting circuit 14 has a summing amplifier 66 instead of a difference amplifier. The output signal $v_{out}$ in this variation represents the sum of the outputs $v_a$ and $v_b$, of the two detectors 60 and 62. FIG. 22a to 22g illustrate the waveforms produced in this variation. The clock waveform (FIG. 22b), the bias waveforms 'a' and 'e,' and the resistance waveforms 'd' (FIG. 22d) and 'g' (FIG. 22f) are as described above. The output waveform $v_{out}$ now takes on three values, '1' representing a magnetic transition that produces a positive leakage field (Δh), '0' representing the non-transition state, and '−1' representing a magnetic transition that produces a negative leakage field (−Δh). An advantage of this type of output signal is the absence of a long-term average direct-current component, because the values '1' and '−1' occur alternately, with equal frequency.

As another variation of the fourth embodiment, the two GMR sensing elements can have the structure described in the second embodiment instead of the structure described in the first embodiment.

Figure 23:
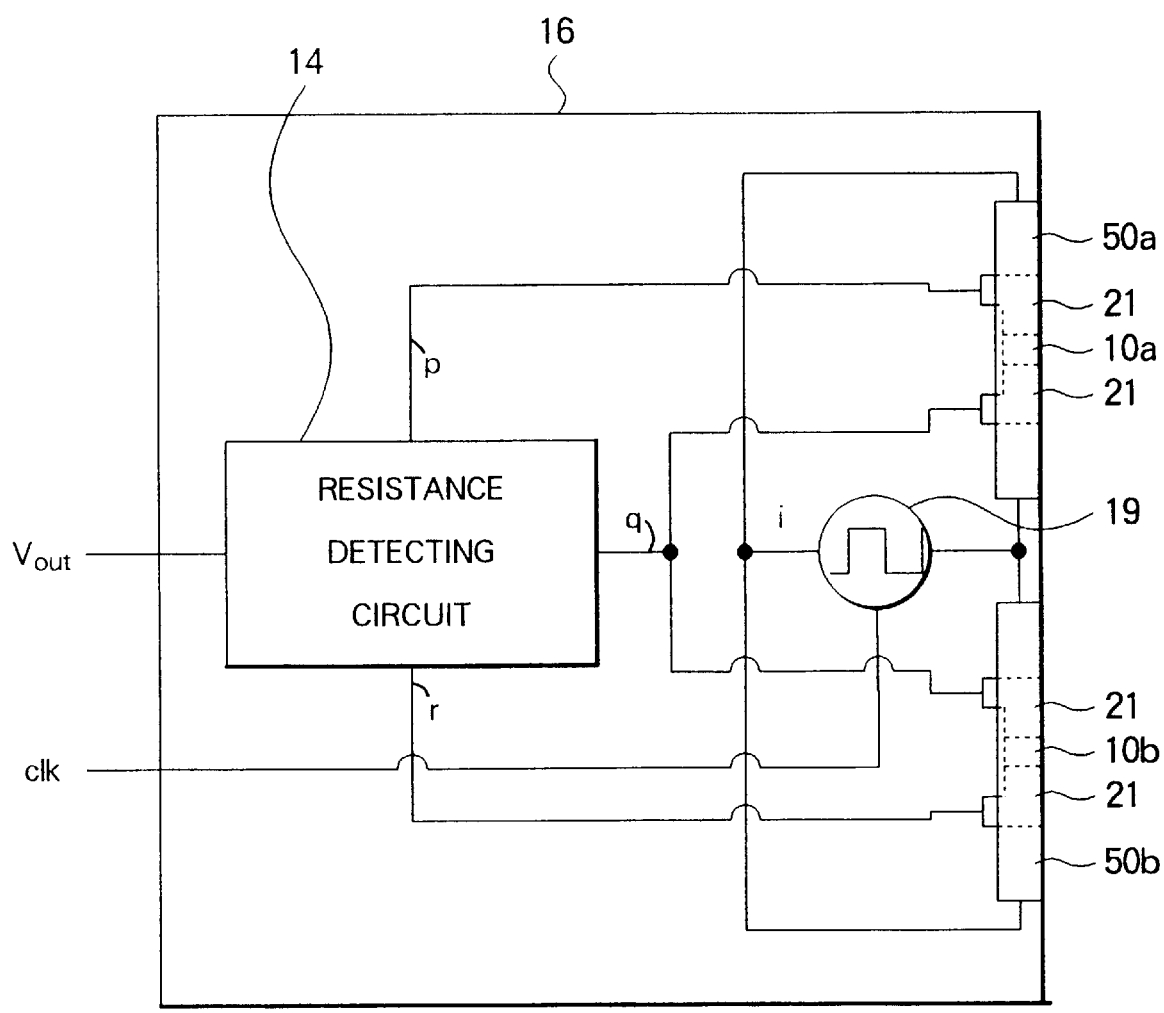
FIG. 23 is a schematic plan view of a magnetoresistive head illustrating a fifth embodiment of the invention.

As a fifth embodiment, FIG. 23 illustrates another magnetoresistive head with two GMR sensing elements 10a and 10b. The two GMR sensing elements 10a and 10b are covered by respective conductive films 50a and 50b, as in the third embodiment. Bath conductive films 50a and 50b receive current 'i' from the alternating-current source 19, but the direction of current flow in the first conductive film 50a is opposite to the direction of current flow in the second conductive film 50b. When current flows upward in the drawing in the first conductive film 50a, for example, current flows downward in the drawing in the second conductive film 50b. The two conductive films 50a and 50b consequently produce alternating magnetic bias fields oriented in opposite directions, as in the fourth embodiment. The resistance detecting circuit 14 is similar to the resistance detecting circuit in the fourth embodiment, and is connected to the GMR sensing elements 10a and 10b as in the fourth embodiment.

The fifth embodiment operates in the same way as the fourth embodiment, detecting both positive and negative magnetic leakage fields. A detailed description will he omitted.

The fifth embodiment admits all of the variations described in the preceding embodiments. The resistance detecting circuit 14 may employ either a difference amplifier or a summing amplifier. The two GMR sensing elements 10a and 10b may have either the structure shown in FIG. 13, or the simpler structure shown in FIG. 15. Alternatively, GMR sensing elements with the structure described in the second embodiment may be employed.

Figure 24:
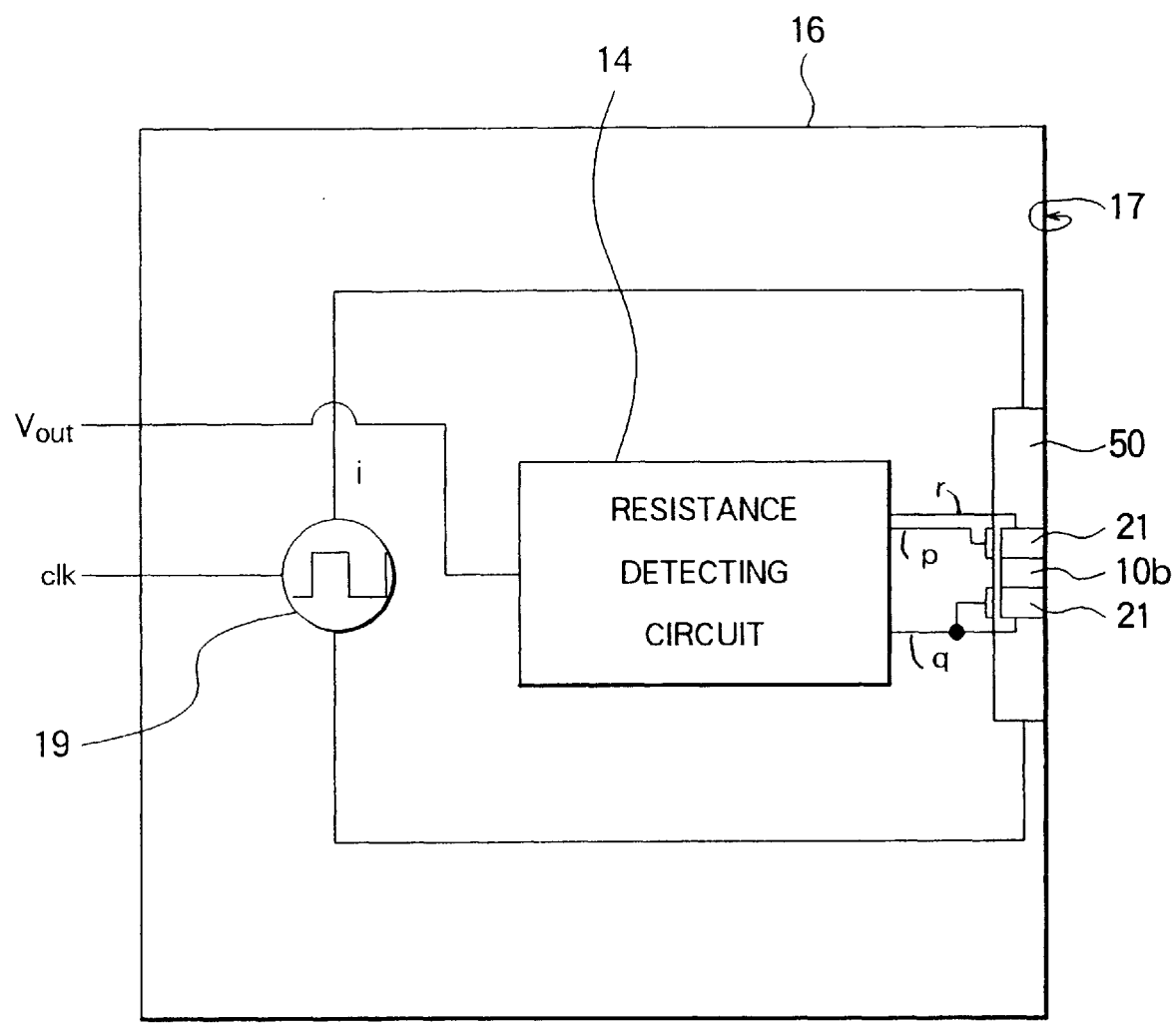
FIG. 24 is a schematic plan view of a magnetoresistive head illustrating a sixth embodiment of the invention.

FIG. 24 illustrates a sixth embodiment which is similar to the fifth embodiment, but has only a single conductive film 50. The first GMR sensing element 10a (not visible) and its electrodes are formed under the conductive film 50. The second GMR sensing element 10b and its electrodes 21 are formed over the conductive film 50. The resistance detecting circuit 14 is coupled to the electrodes of the two GMR sensing elements 10a and 10b by conductive lines 'p,' 'q,' and 'r' as in the fourth and fifth embodiments, and has the structure shown in FIG. 19, with a difference amplifier 64. Alternatively, the structure shown in FIG. 21, with a summing amplifier 66, can be employed.

Figure 25:
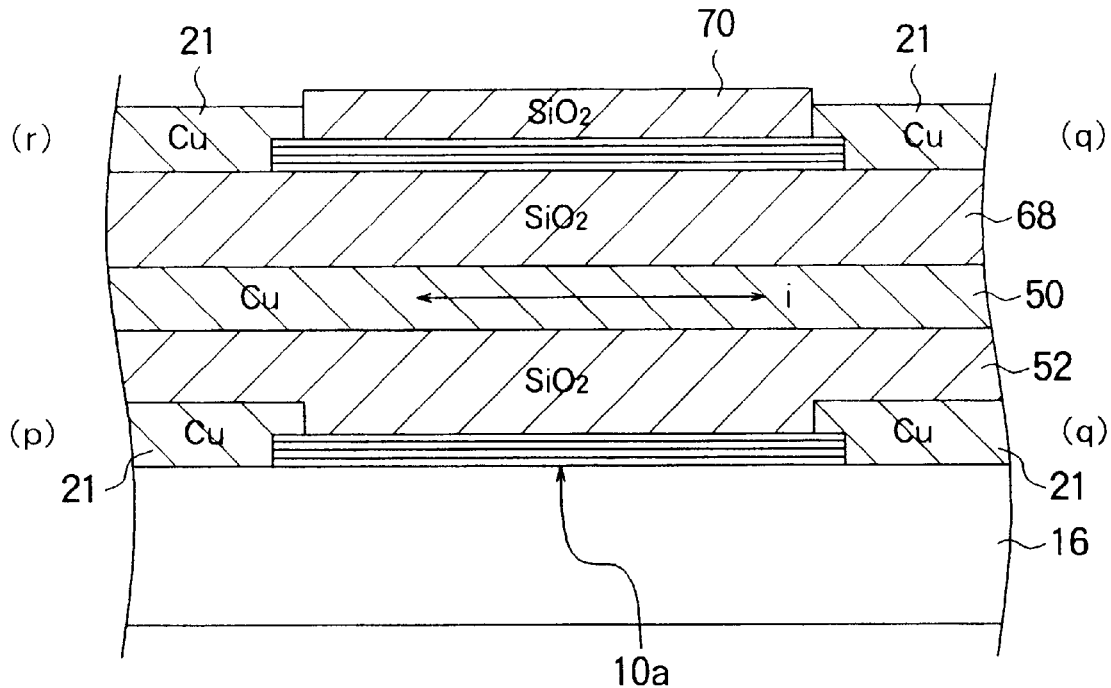
FIG. 25 is a sectional view through the center of the GMR sensing element in FIG. 24, parallel to the adjacent edge of the substrate.
Figure 26:
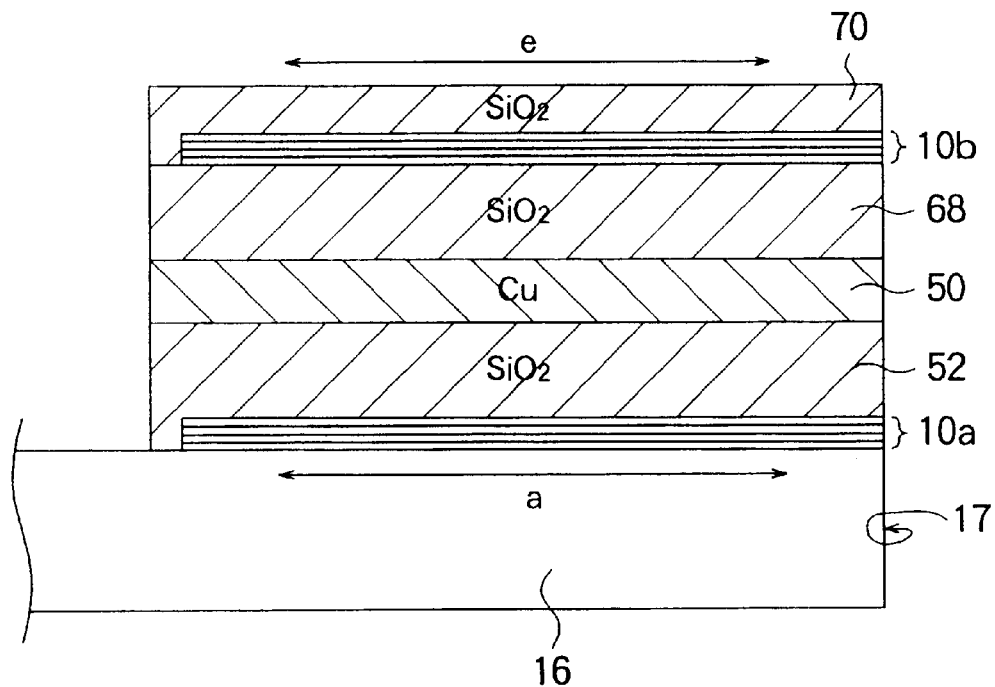
FIG. 26 is a sectional view through the center of the GMR sensing element in FIG. 24, perpendicular to the adjacent edge of the substrate.

FIG. 25 shows a sectional view through the center of the GMR sensing elements, parallel to the adjacent side 17 of the substrate 16. FIG. 26 shows a sectional view through the center of the GMR sensing elements perpendicular to this side 17. As can be seen in these drawings, the conductive film 50 is separated from the first GMR sensing element 10a and its electrodes 21 by a $SiO_2$ dielectric film 52 as in the third embodiment, and is separated from the second GMR sensing element 10b and its electrodes 21 by a second $SiO_2$ dielectric film 68. The letters 'p,' 'q,' and 'r' in FIG. 2 indicate the conductive lines in FIG. 24 to which the electrodes 21 are connected.

A third $SiO_2$ dielectric film 70 is preferably formed over the second GMR sensing element 10b as shown, to simplify the fabrication of the electrodes 21 that feed current through the second GMR sensing element 10b. This dielectric film 70 is patterned so that it is slightly longer and slightly narrower than the second GMR sensing element 10b.

The flow of alternating current through the conductive film 50 is indicated by the arrow marked 'i' in FIG. 25. The alternating magnetic bias field produced by this current flow follows the right-hand rule and therefore biases the two GMR sensing elements 10a and 10b in opposite directions. Arrows 'a' and 'e' in FIG. 26 indicate the bias fields applied to the first GMR sensing element 10a and second GMR sensing element 10b, respectively. At any instant, the magnetic vector of one of these two bias fields (e.g., field 'a' is directed toward the adjacent side 17 of the substrate 16, while the magnetic vector of the other bias field (e.g., field 'e') is directed away from side 17.

The sixth embodiment operates like the fourth and fifth embodiments, as illustrated in FIGS. 17 to 20 if a difference amplifier is employed in the resistance detecting circuit 14, or as illustrated in FIGS. 21 and 22 if a summing amplifier is employed. An advantage of the sixth embodiment is that the two GMR sensing elements 10a and 10b, being disposed in close proximity to one another, sense the same leakage field from the recording medium at the same time, even if the magnetic region producing the leakage field is small.

Figure 27:
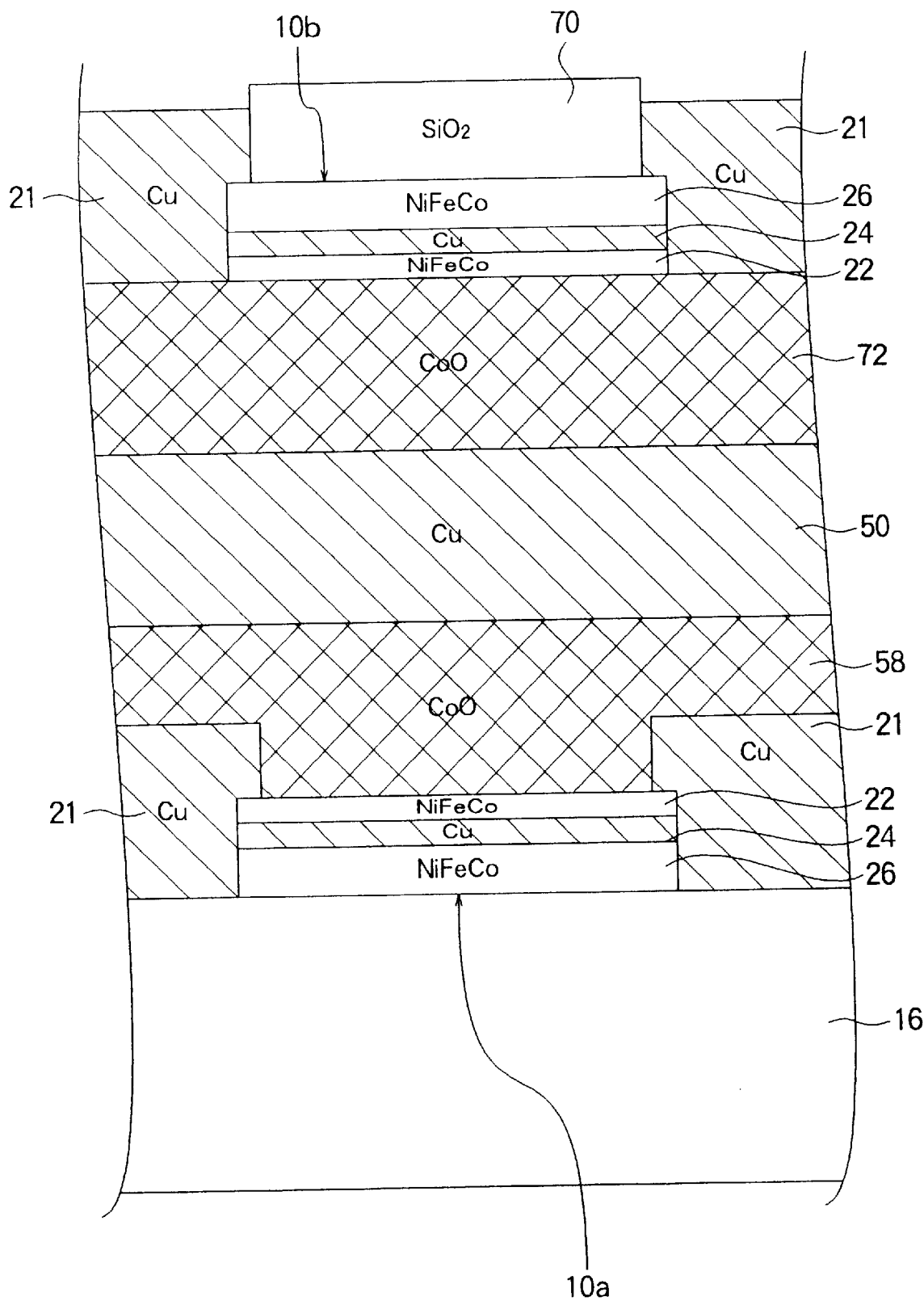
FIG. 27 is a sectional view through the center of the GMR sensing element in FIG. 12, parallel to the adjacent edge of the substrate, illustrating a variation of the sixth embodiment.

FIG. 27 illustrates a variation of the sixth embodiment in which the $SiO_2$ dielectric films 52 and 68 are replaced by dielectric antiferromagnetic films 58 and 72 comprising, for example, cobalt oxide (CoO). The dielectric antiferromagnetic films 58 and 72 also function as the antiferromagnetic layers in the corresponding GMR sensing elements 10a and 10b. This variation of the sixth embodiment reduces the number of separate films that must be deposited by two, thereby reducing the manufacturing cost of the magnetoresistive head.

As another variation of the sixth embodiment, GMR sensing elements with the structure described in the second embodiment may be employed.

Figure 28:
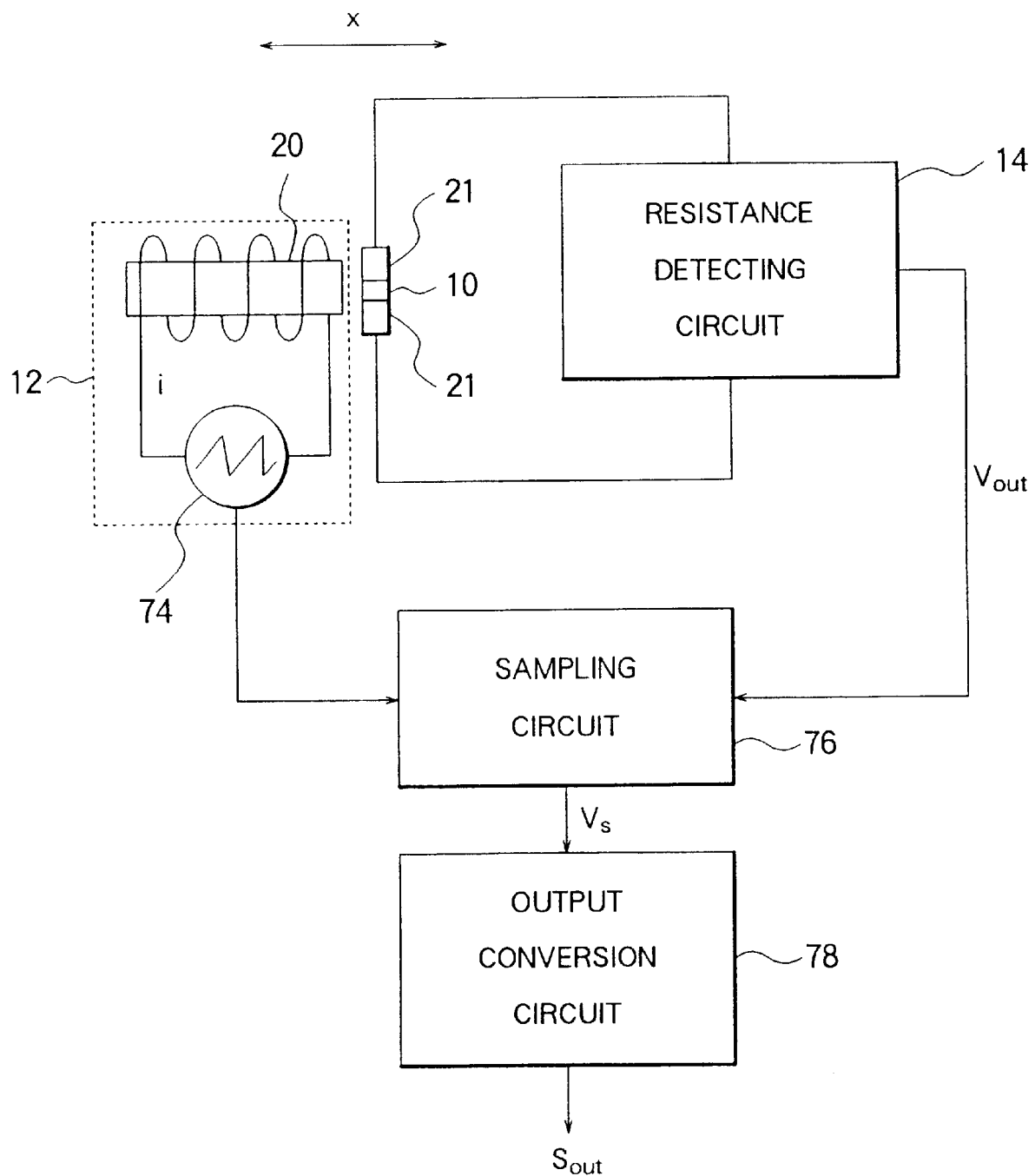
FIG. 28 is a schematic plan view of a magnetoresistive sensor illustrating a seventh embodiment of the invention.

As a seventh embodiment of the invention, FIG. 28 illustrates a magnetoresistive sensor for measuring the strength of an external magnetic field parallel to the direction indicated by arrow 'x.' The GMR sensing element 10, electrodes 21, and resistance detecting circuit 14 are similar to the corresponding elements in the first embodiment. The nagnetic bias field source 12 comprises a solenoid 20 as in the first embodiment, and an alternating-current source 74 that feeds bias current 'i' with a sawtooth waveforn to the solenoid 20.

The output signal $v_{out}$ from the resistance detecting circuit 14 is supplied to a sampling circuit 76, which samples the current generated by the alternating-current source 74 at rising transitions of $v_{out}$. The sampling circuit 76 generates a signal $v_s$ proportional to the sampled values. An output conversion circuit 78 converts this signal $v_s$ to an output signal $s_{out}$ suitable for driving a display device. The output signal $s_{out}$ may be, for example, a direct-current signal that energizes a movable coil, thereby generating a magnetic field that deflects a pointer in a display device of the analog meter type, or a digital signal that is displayed on a digital display device.

The operation of the seventh embodiment will be described with reference to FIGS. 29A, 29B, 30A, and 30B.

Figure 29A:
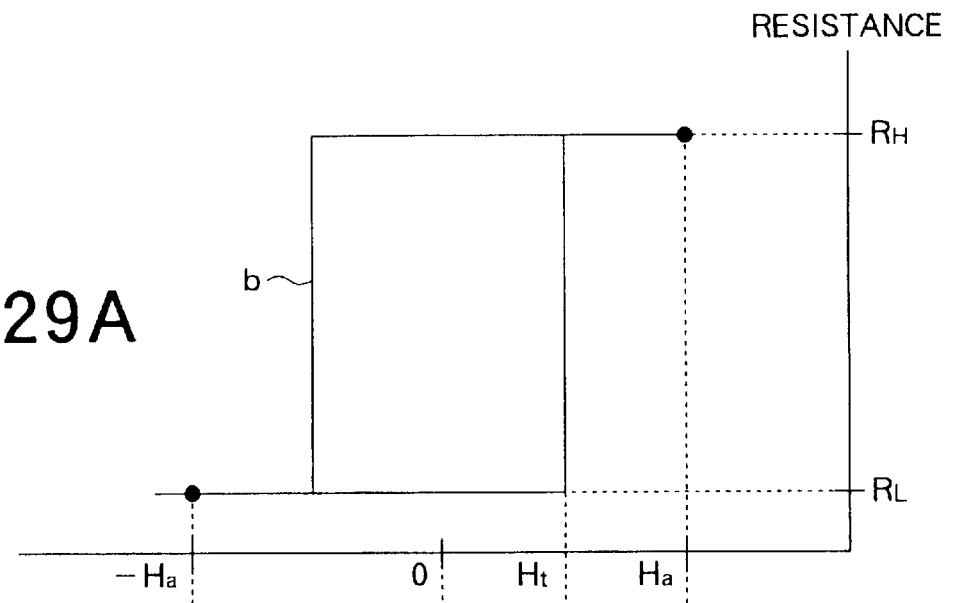
FIGS. 29A and 29B are graphs illustrating the operation of the seventh embodiment.
Figure 29B:
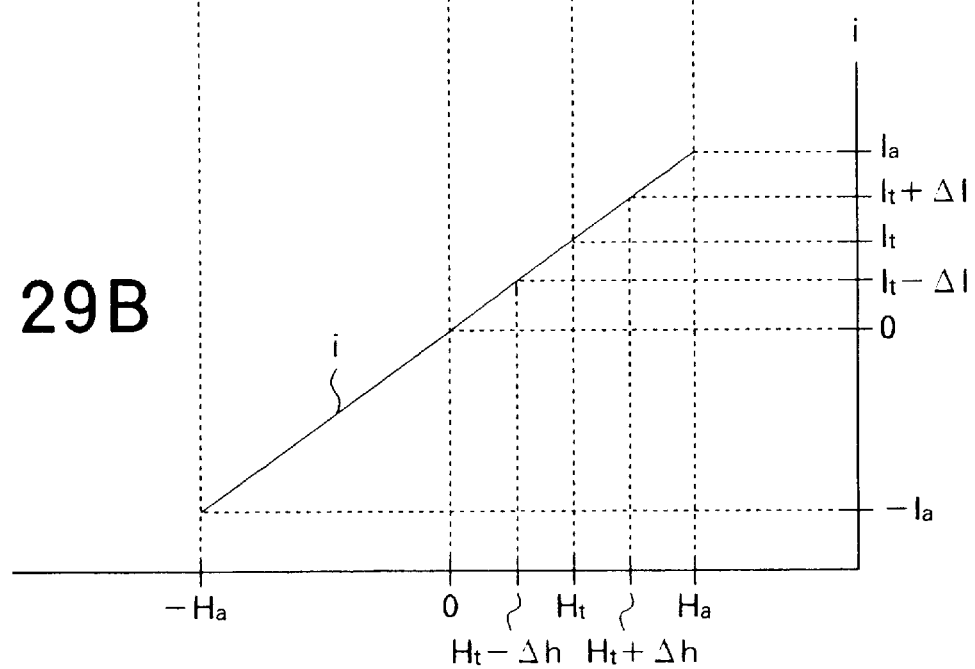

FIG. 29A illustrates the magnetoresistance characteristic 'b' of the GMR sensing element 10, showing magnetic field intensity on the horizontal axis and resistance on the vertical axis. FIG. 29B shows the relationship between the intensity of the magnetic bias field, shown on the horizontal axis, and the bias current 'i' that generates this field, shown on the vertical axis.

The bias current 'i' rises from a negative value, shown as $-I_a$, to a positive value, shown as $I_a$. The magnetic bias field varies between corresponding negative and positive values, shown as $-H_a$ and $H_a$. It is convenient, although not necessary, for the negative and positive values to be symmetric with respect to zero. Both values $-H_a$ and $H_a$ must lie outside the hysteresis loop of the magnetoresistance characteristic 'b.' Thus the extreme positive value $H_a$ of the magnetic bias field must exceed the upward transition point of the magnetoresistance characteristic 'b.'

The bias field $H_t$ at the upward transition point in the magnetoresistance characteristic is produced by a positive current value shown as $I_t$ in FIG. 29B. Slightly larger and smaller currents $I_t+\Delta I$ and $I_t-\Delta I$ produce corresponding bias fields $H_t+\Delta h$ and $H_t-\Delta h$.

Figures 30A, 30B:
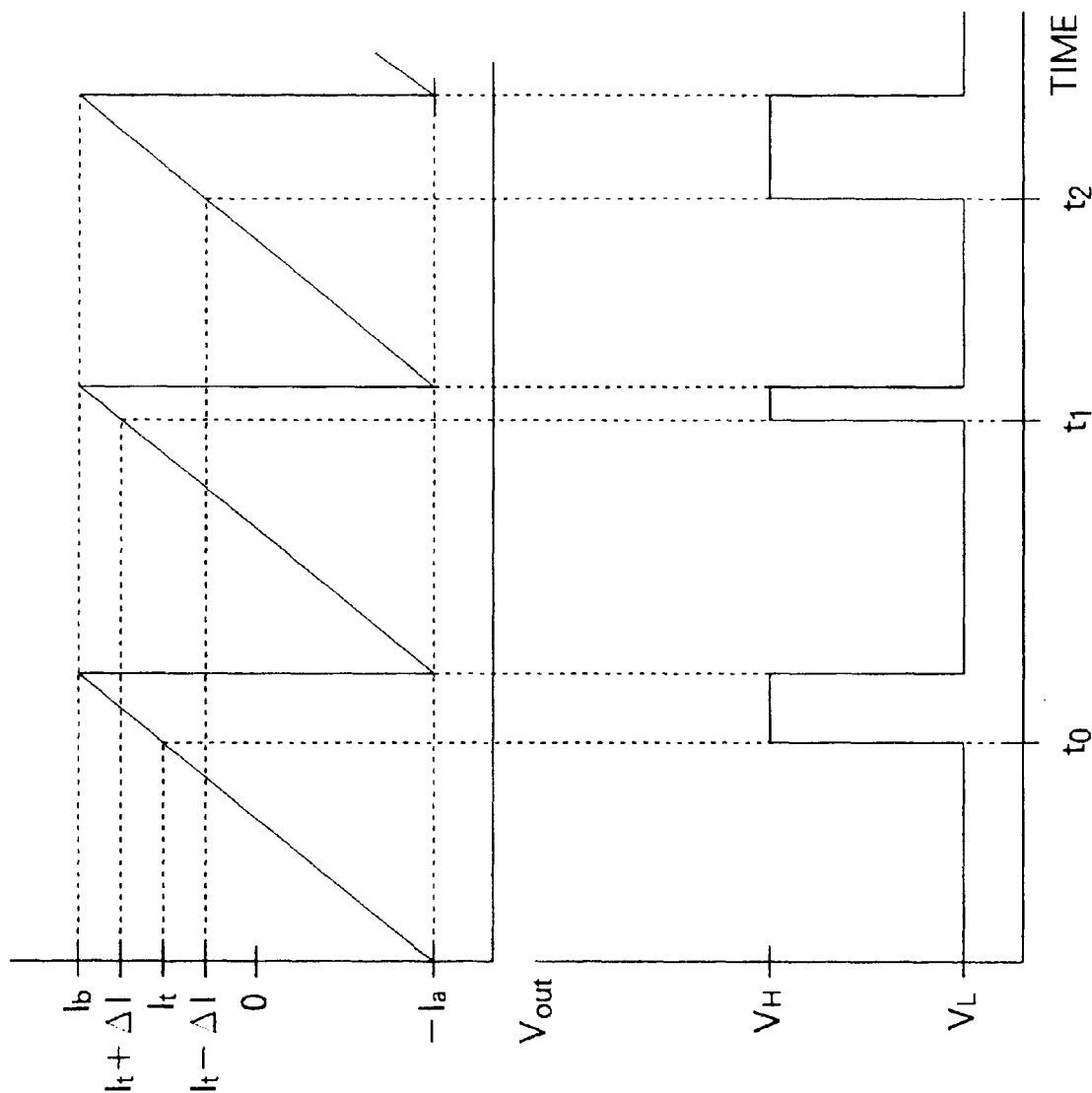
FIGS. 30A and 30B are waveform diagrams illustrating the operation of the seventh embodiment.

FIG. 30A illustrates the sawtooth waveform of the bias current 'i.' FIG. 30B illustrates the corresponding output signal $v_{out}$ of the resistance detecting circuit 14 for three different external field conditions. $V_L$ is the output level produced when the GMR sensing element 10 is in the low-resistance or parallel state; $V_H$ is the output level produced when the GMR sensing element 10 is in the high-resistance or antiparallel state.

If no external magnetic field is present, as the bias current rises from $-I_a$ toward $I_a$, the output signal $v_{out}$ of the resistance detecting circuit 14 rises from $V_L$ to $V_H$ when the bias current reaches the value $I_t$ shown in FIG. 29D. The sampling circuit 76 samples this value $I_t$ at the rise of $v_{out}$ at time $t_0$, and sends a corresponding sample value $v_s$ to the output conversion circuit 78.

If a negative external field $-\Delta h$ is present, the transition from low resistance to high resistance does not occur until the bias field reaches $H_t+\Delta h$. The rise of $v_{out}$ is thus delayed until time $t_1$. The sampling circuit 76 samples the bias current value $I_t+\Delta I$ at time $t_1$, and sends a corresponding sample value $v_s$ to the output conversion circuit 78.

If a positive external field $\Delta h$ is present, the transition from low resistance to high resistance occurs when the bias field reaches $H_t-\Delta h$, and the rise of $v_{out}$ is advanced to time $t_2$. The sampling circuit 76 samples the bias current value $I_t-\Delta I$ at time $t_2$, and sends a corresponding sample value $v_s$ to the output conversion circuit 78.

The output conversion circuit 78 converts the sample values $v_s$ so that when the sampling circuit 76 samples a current of $I_t$, tie output signal $s_{out}$ indicates an external field strength of zero. When the sampled current value is less than $I_t$, the output signal $s_{out}$ indicates a positive external field in the direction 'x' in FIG. 28. When the sampled current value exceeds $I_t$, the output signal $s_{out}$ indicates a negative external field in direction 'x.'

The sensitivity of the magnetoresistive sensor in the seventh embodiment depends on the performance of the alternating-current source 19 and the sampling circuit 76, rather than the performance of the magnetic materials in the GMR sensing element 10. Circuits capable of generating and sampling current values accurately are well known, so high sensitivity is easily achieved.

Figure 31:
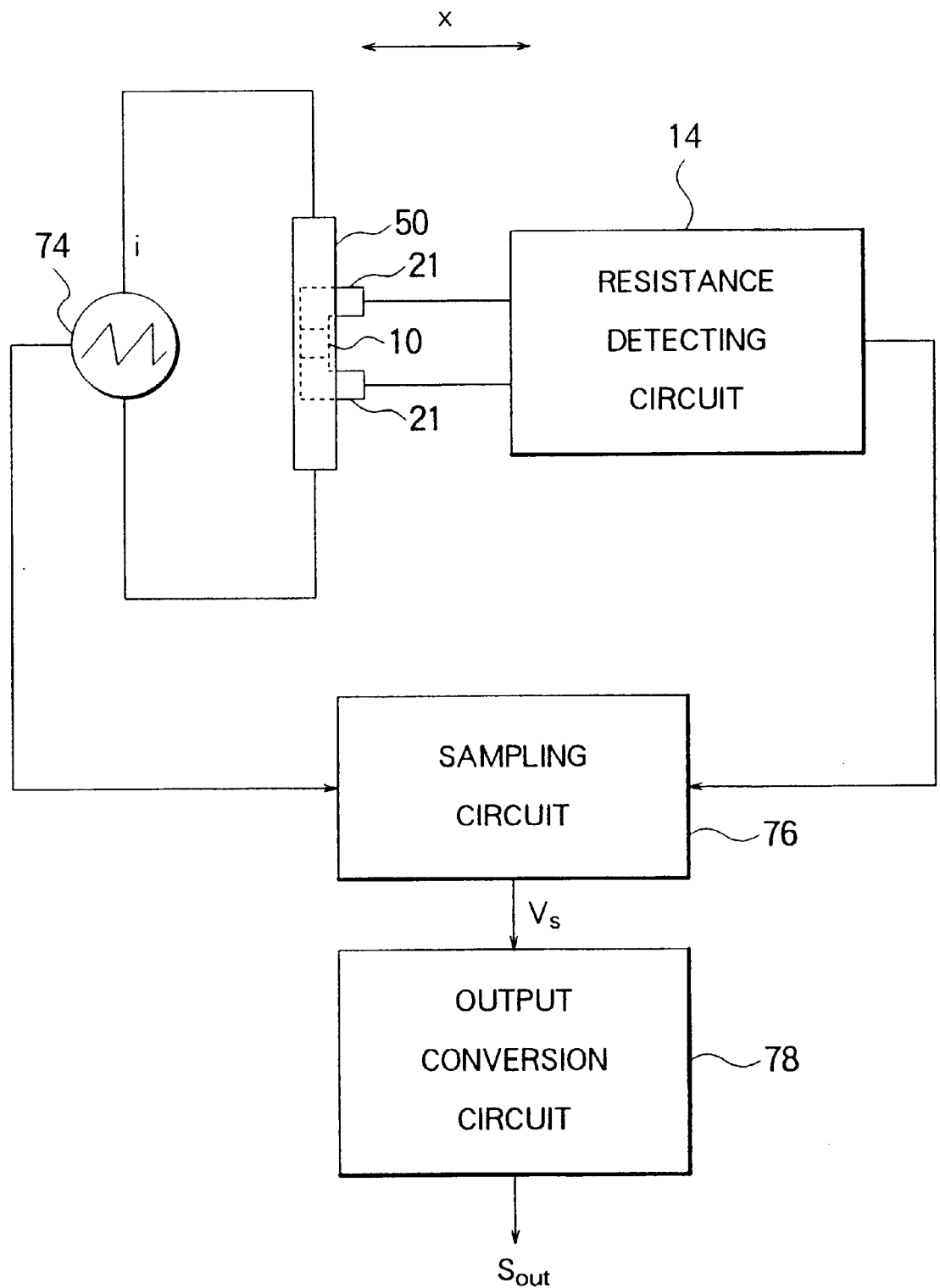
FIG. 31 is a schematic plan view of a magnetoresistive sensor illustrating an eighth embodiment of the invention.

As an eighth embodiment, FIG. 31 illustrates another magnetoresistive sensor, using the same reference numerals as in FIG. 28 for corresponding elements. The alternating-current source 74 in the eighth embodiment feeds bias current 'i' through a conductive film 50 covering the CMR sensing element 10, as in the third embodiment. The GMR sensing element 10, electrodes 21, and conductive film 50 have, for example, the structure shown in FIGS. 13 and 14.

The operation of the eighth embodiment can be understood from the description of the third and seventh embodiments. The output signal $s_{out}$ again indicates external field strength in the direction parallel to arrow 'x.'

The seventh and eighth embodiments can be varied as described in earlier embodiments. For example, the GMR sensing element 38 of the second embodiment can be employed.

The seventh and eighth embodiments are useful in devices such as metal detectors. They can also be used in devices for measuring magnetic fields of arbitrary orientation, by providing an array of GMR sensing elements oriented and biased in different directions.

The seventh and eighth embodiments are not limited to the use of sawtooth bias waveforms. Other waveforms, such as triangular or sine waveforms, can be employed.

The flow of resistance-sensing current through the GMR sensing elements is not limited to the lateral direction shown in the drawings. Other directions of current flow are possible, e.g. from the top surface of the GMR sensing element to the bottom surface of the GMR sensing element.

Those skilled in the art will recognize that further variations are possible within the scope claimed below.

What is claimed is:

1. A magnetoresistive sensor for sensing an external magnetic field, comprising:
    a magnetic bias field source generating an alternating magnetic bias field that alternates between a first direction and a second direction opposite to said first direction;
    a giant magnetoresistive sensing element, disposed within said alternating magnetic bias field, having a first ferromagnetic layer with magnetization pinned in said first direction, and a second ferromagnetic layer with alterable magnetization, the electrical resistance of the giant magnetoresistive sensing element being lower when said second ferromagnetic layer is magnetized in said first direction than when said second ferromagnetic layer is magnetized in said second direction; and
    a resistance detecting circuit coupled to said giant magnetoresistive sensing element, for detecting changes in electrical resistance in said giant magnetoresistive sensing element caused by said external magnetic field and said alternating magnetic bias field acting in combination;
    wherein said alternating magnetic bias field by itself magnetizes said second ferromagnetic layer in only one of said first direction and said second direction.

2. A magnetoresistive head for reading data from a magnetic recording medium, comprising the magnetoresistive sensor of claim 1.

3. The magnetoresistive head of claim 2, wherein the data recorded on said magnetic recording medium produce magnetic fields that, acting in combination with said alternating magnetic bias field, switch the magnetization of said second ferromagnetic layer between said first direction and said second direction, thereby enabling said data to be read.

4. The magnetoresistive sensor of claim 1, wherein said giant magnetoresistive sensing element further comprises an antiferromagnetic layer disposed adjacent said first ferromagnetic layer, pinning the magnetization of said first ferromagnetic layer in said first direction by exchange coupling.

5. The magnetoresistive sensor of claim 1, wherein said first ferromagnetic layer has a higher coercivity than said second ferromagnetic layer.

6. The magnetoresistive sensor of claim 1, wherein said magnetic bias field source comprises:
    an alternating-current source generating an alternating current; and
    a conductive film disposed adjacent said giant magnetoresistive sensing element and conducting said alternating current, thereby generating said alternating magnetic bias field.

7. The magnetoresistive sensor of claim 6, wherein said giant magnetoresistive sensing element further comprises a dielectric antiferromagnetic layer disposed between said first ferromagnetic layer and said conductive film, said dielectric antiferromagnetic layer pinning the magnetization of said first ferromagnetic layer in said first direction by exchange coupling and electrically insulating said first ferromagnetic layer and said second ferromagnetic layer from said conductive film.

8. A magnetoresistive sensor for sensing an external magnetic field, comprising:
    a magnetic bias field source generating an alternating magnetic bias field that alternates between a first direction and a second direction opposite to said first direction;
    a giant magnetoresistive sensing element, disposed within said alternating magnetic bias field, having a first ferromagnetic layer with magnetization pinned in said first direction, and a second ferromagnetic layer with alterable magnetization, the electrical resistance of the giant magnetoresistive sensing element being lower when said second ferromagnetic layer is magnetized in said first direction than when said second ferromagnetic layer is magnetized in said second direction; and
    a resistance detecting circuit coupled to said giant magnetoresistive sensing element, for detecting changes in electrical resistance in said giant magnetoresistive sensing element caused by said external magnetic field and said alternating magnetic bias field acting in combination;
    wherein said alternating magnetic bias field by itself causes the magnetization of said second ferromagnetic layer to alternate between said first direction and said second direction.

9. The magnetoresistive sensor of claim 8, wherein said magnetic bias field source comprises an alternating-current source generating an alternating current that produces said alternating magnetic bias field.

10. The magnetoresistive sensor of claim 9, further comprising:
    a sampling circuit coupled to said alternating-current source, for sampling said alternating current when said chances in electrical resistance occur, thereby generating sample values; and
    an output conversion circuit coupled to said sampling circuit, for converting said sample values to an output signal indicating said external magnetic field.

11. The magnetoresistive sensor of claim 8, wherein said giant magnetoresistive sensing element further comprises an antiferromagnetic layer disposed adjacent said first ferromagnetic layer, pinning the magnetization of said first ferromagnetic layer in said first direction by exchange coupling.

12. The magnetoresistive sensor of claim 8, wherein said first ferromagnetic layer has a higher coercivity than said second ferromagnetic layer.

13. The magnetoresistive sensor of claim 8, wherein said magnetic bias field source comprises:
   an alternating-current source generating an alternating current; and
   a conductive film disposed adjacent said giant magnetoresistive sensing element and conducting said alternating current, thereby generating said alternating magnetic bias field.

14. The magnetoresistive sensor of claim 13, wherein said giant magnetoresistive sensing element further comprises a dielectric antiferromagnetic layer disposed between said first ferromagnetic layer and said conductive film, said dielectric antiferromagnetic layer pinning the magnetization of said first ferromagnetic layer in said first direction by exchange coupling and electrically insulating said first ferromagnetic layer and said second ferromagnetic layer from said conductive film.

15. A magnetoresistive head for reading data in the form of an external magnetic field from a recording medium, comprising:
   a magnetic bias field source generating a first alternating magnetic bias field and a second alternating magnetic bias field complementary to said first alternating magnetic bias field;
   a first giant magnetoresistive sensing element disposed within said first alternating magnetic bias field;
   a second giant magnetoresistive sensing element disposed within said second alternating magnetic bias field; and
   a resistance detecting circuit coupled to said first giant magnetoresistive sensing element and said second giant magnetoresistive sensing element, for detecting changes in electrical resistance of said first giant magnetoresistive sensing element caused by said external magnetic field and said first alternating magnetic bias field acting in combination, and detecting changes in electrical resistance of said second giant magnetoresistive sensing element caused by said external magnetic field and said second alternating magnetic bias field acting in combination;
   wherein said resistance detecting circuit generates an output signal by taking one of a sum and a difference of said changes in electrical resistance of said first giant magnetoresistive sensing element and said changes in electrical resistance of said second giant magnetoresistive sensing element.

16. The magnetoresistive head of claim 15, wherein each of said first giant magnetoresistive sensing element and said second giant magnetoresistive sensing element separately comprises:
   a first ferromagnetic layer with magnetization pinned in a first direction; and
   a second ferromagnetic layer with alterable magnetization, the electrical resistance of the giant magnetoresistive sensing element being lower when said second ferromagnetic layer is magnetized in said first direction than when said second ferromagnetic layer is magnetized in a second direction opposite to said first direction.

17. The magnetoresistive head of claim 16, wherein said first alternating magnetic bias field by itself magnetizes the second ferromagnetic layer in said first giant magnetoresistive sensing element in only one of said first direction and said second direction, and said second alternating magnetic bias field by itself magnetizes the second ferromagnetic layer in said second giant magnetoresistive sensing element in only one of said first direction and said second direction.

18. The magnetoresistive head of claim 17, wherein the data recorded on said magnetic recording medium produce magnetic fields that, acting in combination with said first alternating magnetic bias field, switch the magnetization of second ferromagnetic layer in said first giant magnetoresistive sensing element between said first direction and said second direction, and also produce magnetic fields that, acting in combination with said second alternating magnetic bias field, switch the magnetization of second ferromagnetic layer in said second giant magnetoresistive sensing element between said first direction and said second direction.

19. The magnetoresistive head of claim 16, wherein each of said first giant magnetoresistive sensing element and said second giant magnetoresistive sensing element separately comprises an antiferromagnetic layer disposed adjacent said first ferromagnetic layer, pinning the magnetization of said first ferromagnetic layer in said first direction by exchange coupling.

20. The magnetoresistive head of claim 16 wherein, in each of said first giant magnetoresistive sensing element and said second giant magnetoresistive sensing element, said first ferromagnetic layer has a higher coercivity than said second ferromagnetic layer.

21. The magnetoresistive head of claim 16, wherein said magnetic bias field source comprises:
   an alternating-current source generating an alternating current; and
   a conductive film disposed adjacent said first giant magnetoresistive sensing element and said second giant magnetoresistive sensing element and conducting said alternating current, thereby generating said first alternating magnetic bias field and said second alternating magnetic bias field.

22. The magnetoresistive head of claim 21, wherein said first giant magnetoresistive sensing element is disposed below said conductive film, and said second giant magnetoresistive sensing element is disposed above said conductive film.

23. The magnetoresistive head of claim 21, wherein said first giant magnetoresistive sensing element comprises a first dielectric antiferromagnetic layer disposed between the first ferromagnetic layer in said first giant magnetoresistive sensing element and said conductive film, said first dielectric antiferromagnetic layer pinning the magnetization of the first ferromagnetic layer in said first giant magnetoresistive sensing element in said first direction and electrically insulating the first ferromagnetic layer and the second ferromagnetic layer in said first giant magnetoresistive sensing element from said conductive film.

24. The magnetoresistive head of claim 23, wherein said first giant magnetoresistive sensing element is disposed below said conductive film, and said second giant magnetoresistive sensing element is disposed above said conductive film.

25. The magnetoresistive head of claim 24, wherein said second giant magnetoresistive sensing element comprises a second dielectric antiferromagnetic layer disposed between the first ferromagnetic layer in said second giant magnetoresistive sensing element and said conductive film, said second dielectric antiferromagnetic layer pinning the magnetization of the first ferromagnetic layer in said second giant magnetoresistive sensing element in said first direction and electrically insulating the first ferromagnetic layer and the second ferromagnetic layer in said second giant magnetoresistive sensing element from said conductive film.

26. A method of sensing an external magnetic field, comprising the steps of:

applying an alternating magnetic bias field to a giant magnetoresistive sensing element having a magnetoresistance characteristic with a hysteresis loop, said alternating magnetic bias field alternating between two points outside said hysteresis loop, said two points being disposed on opposite sides of said hysteresis loop; and detecting changes in electrical resistance of said giant magnetoresistive sensing element caused by said external magnetic field and said alternating magnetic bias field acting in combination.

27. The method of claim 26, wherein said giant magnetoresistive sensing element comprises a first ferromagnetic layer with magnetization pinned in a first direction and a second ferromagnetic layer with alterable magnetization, and said alternating magnetic bias field alternates between said first direction and a second direction opposite to said first direction.

28. The method of claim 26, wherein said step of applying an alternating magnetic bias field is carried out by passing alternating current through a conductive film disposed adjacent said giant magnetoresistive sensing element.

29. The method of claim 26, further comprising the steps of:

providing an alternating current that produces said alternating magnetic bias field;

sampling said alternating current when said changes in electrical resistance occur, thereby obtaining sample values; and converting said sample values to an output signal indicating said external magnetic field.

30. A method of sensing an external magnetic field, comprising the steps of:

applying a first alternating magnetic than bias field to a first giant magnetoresistive sensing element having a magnetoresistance characteristic with a hysteresis loop, said first alternating magnetic bias field alternating between a point inside said hysteresis loop and a point outside said hysteresis loop; and detecting changes in electrical resistance of said first giant magnetoresistive sensing element caused by said external magnetic field and said first alternating magnetic bias field acting in combination.

31. The method of claim 30, further comprising the steps of:

applying a second alternating magnetic bias field to a second giant magnetoresistive sensing element, said second alternating magnetic bias field being complementary to said first alternating magnetic bias field; and detecting changes in electrical resistance of said second giant magnetoresistive sensing element caused by said external magnetic field and said second alternating magnetic bias field acting in combination.

32. The method of claim 31, further comprising the step of generating an output signal by taking a sum of said changes in electrical resistance of said first giant magnetoresistive sensing element and said changes in electrical resistance of said second giant magnetoresistive sensing element.

33. The method of claim 31, further comprising the step of generating an output signal by taking a difference of said changes in electrical resistance of said first giant magnetoresistive sensing element and said changes in electrical resistance of said second giant magnetoresistive sensing element.

34. The method of claim 30, wherein said first giant magnetoresistive sensing element comprises a first ferromagnetic layer with magnetization pinned in a first direction and a second ferromagnetic layer with alterable magnetization, and said first alternating magnetic bias field alternates opposite to said first direction.

35. The method of claim 30, wherein said step of applying a first alternating magnetic bias field is carried out by passing alternating current through a conductive film disposed adjacent said first giant magnetoresistive sensing element.

* * * * *